(12) United States Patent
Regaard et al.

(10) Patent No.: US 7,751,458 B2
(45) Date of Patent: Jul. 6, 2010

(54) HIGH POWER LASER DIODE ARRAY COMPRISING AT LEAST ONE HIGH POWER DIODE LASER AND LASER LIGHT SOURCE COMPRISING THE SAME

(75) Inventors: Boris Regaard, Ypsilanti, MI (US); Thorsten Schmidt, Plymouth, MI (US); Stefan Heinemann, Ann Arbor, MI (US)

(73) Assignee: Fraunhofer USA, Inc. Center for Laser Technology, Plymouth, MI (US)

( * ) Notice: Subject to any disclaimer, the term of this patent is extended or adjusted under 35 U.S.C. 154(b) by 117 days.

(21) Appl. No.: 12/270,945

(22) Filed: Nov. 14, 2008

(65) Prior Publication Data
US 2009/0129420 A1 May 21, 2009

Related U.S. Application Data
(60) Provisional application No. 60/988,577, filed on Nov. 16, 2007.

(30) Foreign Application Priority Data
Jan. 21, 2008 (EP) .................................. 08100714
Mar. 31, 2008 (EP) .................................. 08103278

(51) Int. Cl.
*H01S 5/00* (2006.01)
*H01S 3/08* (2006.01)
(52) U.S. Cl. ...................... 372/50.12; 372/101; 372/109

(58) Field of Classification Search .............. 372/50.12, 372/101, 109
See application file for complete search history.

(56) References Cited

U.S. PATENT DOCUMENTS

| 5,099,488 | A | 3/1992 | Ahrabi et al. |
| 6,771,686 | B1 | 8/2004 | Ullman et al. |
| 2003/0048819 | A1 | 3/2003 | Nagano et al. |
| 2004/0114648 | A1 | 6/2004 | Nagano et al. |
| 2005/0069260 | A1 | 3/2005 | Klimek et al. |

FOREIGN PATENT DOCUMENTS

EP 1830443 9/2006

*Primary Examiner*—Armando Rodriguez
(74) *Attorney, Agent, or Firm*—Renner, Otto, Boisselle & Sklar

(57) ABSTRACT

Array comprising high power laser diode comprising laser light emitters, each defining, in a direction perpendicular to direction of propagation of an output laser beam, a fast axis and a slow axis; fast axis collimating means for collimating output laser beams in fast axis direction; and slow axis beam shaping means for collimating or focussing output laser beams in slow axis direction, said slow axis beam shaping means disposed external to said high power laser diode; wherein said laser light emitters are displaced relative to each other in fast axis direction or in fast and slow axis direction by equidistant spacings, respectively; and including optical means for forming output laser beam profile in far field of all laser light emitters consisting of said fast and slow axis collimated or focussed output laser beams arranged adjacently in seamless manner in one or two dimensions with optical fill factor of about 100%.

23 Claims, 23 Drawing Sheets

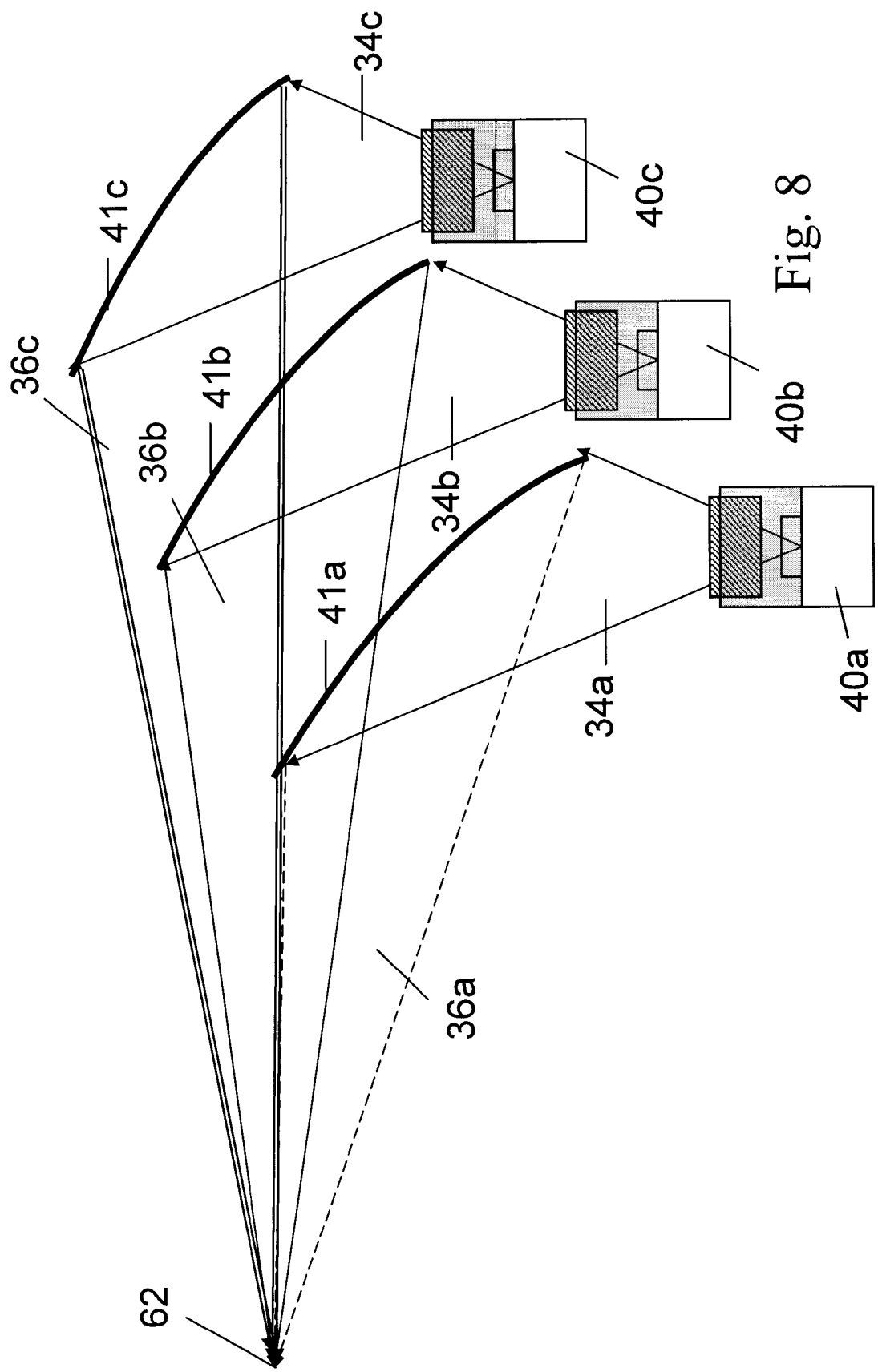

HIGH POWER LASER DIODE ARRAY COMPRISING AT LEAST ONE HIGH POWER DIODE LASER AND LASER LIGHT SOURCE COMPRISING THE SAME

CROSS-REFERENCE TO RELATED APPLICATIONS

The present application is related to and claims priority and benefit under 35 U.S.C. §119(e) to U.S. Provisional Application No. 60/988,577, filed 16 Nov. 2007, and is related to and claims priority under 35 U.S.C. §119(a) to European Application Nos. 08100714.8As, filed 21 Jan. 2008 and 08103278.1, filed 31 Mar. 2008, the entirety of each of which is fully incorporated herein by reference as if fully contained herein.

FIELD OF THE INVENTION

The present invention relates in general to high power diode lasers and relates in particular to a high power laser diode array comprising at least one high power diode laser having multiple emitters and more preferably comprising a plurality of high power diode lasers having multiple emitters, a method for manufacturing the same and an optical setup for coupling the output of such a high power laser diode array into an optical fibre.

BACKGROUND OF THE INVENTION

Most high power diode lasers are edge emitting semiconductors, with the laser emitted from one facet. Typical dimensions of one diode laser are a facet of 500 microns wide and 100 microns high with a length between 0.6 mm to 3 mm. The optical brightness of the diode laser is defined by its internal structure. Parallel to the pn-junction (fast axis) the emission is diffraction limited and emerging from an aperture of about 1 micron with a divergence of typical 30 degrees (half angle for 1/e2), in a direction parallel to the mounting surface of the diode laser the light is emerging from an aperture with a typical size in the range of several microns to 200 micron and a typical divergence of 7 degrees (half angle for 1/e2).

High power diode lasers with output powers of 100 W and more are realized by arranging multiple edge emitting diode lasers, so called single chips, next to each other in one semiconductor, so called array. In such cases, special measures have to be taken to provide for an efficient dissipation of heat generated by the multiple diode lasers.

Focusing the light of edge emitting diode lasers to a small spot requires optical elements for collimation and focusing. However, it is noted that the beam quality of such a high power laser diode is highly asymmetric. Typically, in fast axis the beam quality is diffraction limited in fast axis, characterized by $M^2=1$ and in slow axis the beam quality for a 100 micron broad aperture is in the range of $M^2=24$. The issue of asymmetric beam quality in fast and slow axis is much more severe for high power arrays, with multiple single chips arranged in one semiconductor next to each other in slow axis direction. At a beam quality of $M^2=1$ in fast axis, the beam quality in slow axis can decrease to $M^2=1.000$. Because the output laser beam is highly asymmetric, typically two collimating steps are performed in the prior art. Typically first micro-optical lenses are used for collimating the highly divergent beam in fast axis and secondly, collimating lenses for slow axis collimation are deployed resulting in a beam collimated in both axis that can subsequently focused with one or more lenses to a small spot. Nevertheless, the symmetry of said collimated output laser beams is not satisfactory for many applications. Accordingly, there exists a need to provide simple and cost-efficient solutions to enable high power laser diodes to output laser beams of high beam quality, in particular high symmetry.

For coupling the light into optical fibers, which is a preferred application of the subject-matter of the present application, the beam quality must be symmetrized in fast and slow axis. Several concepts have been developed for beam shaping of diode laser arrays in the past. State of the art solutions use refractive or reflective optics to cut the emission in slow axis in several sections with subsequent rearranging in fast axis. Because of the high divergence angle in the fast axis direction, all these approaches dispose a collimating lens for fast axis collimation at very short distances from the emitting facet of the laser diodes, i.e. make use of collimating lenses of short focal length for fast axis collimation. This approach usually requires precise alignment of multiple micro-optical lenses in six axes, which makes the whole setup relatively complex and expensive. Nevertheless, a substantial loss of beam quality is experienced because of unavoidable tolerances in the parts, such as smile of the lens or diode array or the optical components for beam shaping, as well as in the alignment of the laser light emitter(s) to the associated optical component(s) and the optical components themselves.

Laser diode arrays of the above kind are disclosed e.g. by US 2003/0048819 A1, US 2004/0114648 A1, U.S. Pat. No. 5,715,264 and U.S. Pat. No. 5,099,488.

In the following a high power laser diode, which forms the basis of the subject-matter of this application and is disclosed in EP 1 830 443 A1 and U.S. Ser. No. 10/778,806 of the applicants, will be described with reference to FIG. 1a to 3. As shown in FIG. 1a, the high power laser diode comprises a common heat sink 106 and a planar alignment substrate 110. The laser diodes 102 are mounted on submounts 101 which are mounted onto the top surface of the common heat sink 106. As shown in FIG. 1b, cut-outs formed by a central cut-out portion 114, a left cut-out portion 115 and a right cut-out portion 116 are formed in the alignment substrate 110, said cut-out portions being formed as through-holes in the alignment substrate 110. As shown in FIG. 1a, the laser diodes 102 mounted onto the submounts 101 are fully received by the cut-outs 114-116 of the alignment substrate 110. As shown in FIG. 1b, the alignment substrate 110 comprises stops 119 formed as edges of the cut-outs 114-116. These stops 119 enable a precise alignment of the laser diodes 101 and/or submounts 102 as will be described in more detail with reference to FIG. 4a to 5b below.

As shown in FIG. 1a, mirrors 107 are unitarily provided on the upper surface of the heat sink 106 for deflecting the output laser beams by an angle of 90 degrees to a direction of light propagation designated by z' in the following (cf. FIG. 2a). The deflected light beams pass through the right cut-out 116 provided in the alignment substrate 110 near the front facet of the respective laser diode 102.

As shown in FIG. 2a, a planar spacer substrate 130 of a transparent material, such as glass, is bonded onto the top surface of the alignment substrate 110. Further, the fast axis collimating lenses 133, optionally made as an array, are bonded onto the top surface of the spacer substrate 130. For this purpose the fast axis collimating lenses 133 are formed as plano-convex lenses, the rear side of which being bonded onto the top surface 301 of the spacer substrate 130. The spacer substrate 130 is used for precisely defining the distance between the light emitting facets of the laser diode chips 102 and the downstream fast axis collimating lenses 133. Once a proper orientation and alignment of the lens array has been found, this orientation and alignment is fixed by bonding the lens array 133 to the spacer substrate 130. This high power laser diode as described above emits a plurality of fast axis collimated output laser beams, which propagate in the same direction (z') at equidistant spacings between neighbouring output laser beams and are aligned along a single line.

The set-up relies on highly accurate placement of the diode laser on the heat sink in six axis, which is practically very challenging. Based on an individual alignment of the FAC lens, the assembly tolerances for the diode laser can be significantly reduced for four axis and by a proper design of the beam size of the collimated beam.

FIG. 3a shows a setup for superposing two fast axis collimated output laser beams of high power laser diodes according to FIGS. 2a and 2b each with an optical fill factor of 50% and for subsequent slow axis collimation as disclosed in EP 1 830 443 A1 and U.S. Ser. No. 10/778,806 of the applicant(s). Two high power laser diode modules configured as outlined above are arranged perpendicular to each other. While the output laser beam of the module on the left-hand side passes the beam superposition prism 136 substantially unaffected, the output laser beam of the module on the right-hand side is reflected by the slanted surface of prism 136 such that the two output laser beams are superposed with collinear optical axes. Downstream of prism 136 there is provided a common collimating lens 137 for slow axis collimation to generate a fast and slow axis collimated output laser beam 138. Thus, two rows of laser diode emitters are interleaved and the output laser beams superposed. For this purpose, a fill rate of approx. 50% is used to enable an output laser beam in the shape of a long line, but with identical divergences in slow and fast axis of the collimated beam. The superposition of two output laser beams as shown in FIG. 3a induces further optical losses through inaccuracies of the optical inteleaver and alignment tolerances of the individual rows.

U.S. Pat. No. 6,771,686 B1 discloses a high power laser diode array comprising several laser diode bars with an associated fast axis collimator which is segmented in fast axis direction and a slow axis collimator. The planes of the diode laser bars are offset relative to each other by half a beam pitch. An optical element or a coupling element, which is located between the slow axis collimators and a focussing optics, the beams of the emitters are interleaved with each other to obtain a filling factor of 100%. This arrangement needs an optical interleaver for interleaving the output laser beams.

US 2005/0069260 A1 discloses a setup for combining a plurality of laser beams using interleaved optical plates.

SUMMARY OF THE INVENTION

It is an object of the present invention to provide a simple arrangement of diode lasers wherein each output laser beam is individually collimated in fast and slow axis by a set of dedicated lenses or lens sections and wherein an output laser beam profile is formed, without the use of an optical interleaver, consisting of a plurality of fast and slow axis collimated or focussed output laser beams arranged adjacent to each other, i.e. next to each other, in a seamless manner in one dimension or in two dimensions with an optical fill factor of 100% or close to 100%. It is further a related object of the present invention to arrange the diode lasers such that all diode lasers are effectively coupled into optical fibers by imaging all facets of the diode lasers on the fiber end by means of reflective or refractive optics only, avoiding any beam shaping optics for rearranging the emission of diode lasers. It is a further related object of the present invention to further enhance the imaging and optical loss characteristics of the high power laser diode of the above configuration and at the same time to enable a simple and cost-efficient configuration for fast and slow axis collimation of the output laser beams at less tight tolerances. According to a further related aspect of the present invention corresponding methods for manufacturing such a high power laser diode are to be provided.

The above and further objects are achieved by the subject-matter as set forth in the appended claims.

A high power laser diode array according to the present invention comprises at least one high power laser diode comprising a plurality of laser light emitters for emitting output laser beams, each defining, in a direction perpendicular to a direction of propagation of an output laser beam, a fast axis and a slow axis; fast axis collimating means for collimating said output laser beams in fast axis direction to provide fast axis collimated output laser beams; and slow axis beam shaping means for collimating or focussing said output laser beams in slow axis direction, said slow axis beam shaping means being disposed external to said at least one high power laser diode; wherein said laser light emitters are displaced relative to each other in fast axis direction or in fast and slow axis direction by equidistant spacings, respectively; and an optical means is provided for forming an output laser beam profile in the far field of all laser light emitters consisting of a said plurality of fast and slow axis collimated or focussed output laser beams arranged adjacent, i.e. next to each in a seamless manner in one dimension or in two dimensions with an optical fill factor of 100% or close to 100%. According to the invention the slow axis beam shaping means is comprised by or formed by said optical means.

Thus, according to the invention the same optical means that serve(s) to image the output laser beams such as to arrange the fast and slow axis collimated output laser beams adjacent to each other in a seamless manner also serve(s) as the slow axis beam shaping means for collimating or focussing said output laser beams in slow axis direction. According to the present invention, the output laser beams which are emitted by the individual laser light emitters propagate already very close to each other, due to the particular arrangement of the high power laser diodes as set forth below. This means, that only very narrow gaps exist between the output laser beams which are emitted by the individual laser light emitters or that the overall beam profile of the high power laser diode array even consists of said plurality of fast and slow axis collimated or focussed output laser beams arranged adjacent, i.e. next to each in a seamless manner in one dimension or in two dimensions with an optical fill factor of 100% or close to 100%. Thus, the optical means does not rearrange the individual output laser beams, as in the prior art, but only reduces the gap between adjacent output laser beams, if this should exist, to substantially zero to achieve the fill factor of 100%. According to some embodiments of the present invention, the optical means also focuses or collimates the fast axis collimated output laser beams in slow axis direction. According to other embodiments, however, a slow axis collimating means might also be disposed downstream of the optical means.

According to an embodiment the laser light emitters are displaced relative to each other in a chessboard-like manner so that in combination with a suitable optical means, such as an array of parabolic hollow mirrors or refractive optical lenses, the output laser beams are arranged next to each other in a seamless manner in one or two dimensions, i.e. such that neighbouring output laser beams are substantially adjacent to each other, without a significant gap of low or vanishing light intensity therebetween. In this manner an optical fill factor of the output laser beam profile of 100% or close to 100% is achieved. More specifically the output laser beam profile preferably consists of a plurality of output laser beams that are collimated or focussed in fast axis direction and collimated or focussed in slow axis direction and arranged in a chessboard-like manner. Output laser beams of neighbouring rows may be displaced by half a beam pitch which enables to efficiently generate output laser beam profiles of arbitrary shape, such as circular, elliptical, line-shaped, rectangular, etc. beam profiles.

According to an embodiment the laser light emitters of each high power laser diode are disposed at equidistant spacings relative to each other in fast axis direction, preferably along a single row. Furthermore, neighbouring high power laser diodes are offset relative to each other, at equidistant spacings, in slow axis direction. In this manner, the above chess-board like arrangement of the output laser beams is achieved without the use of additional interleaving means that, according to the prior art, are used to rearrange or at least deflect the output laser beams.

According to an embodiment the fast axis collimating means is or are integrated into a respective high power laser diode, using a planar substrate means which receives or supports the fast axis collimating optical element, such as a refractive lens, a diffractive optical element or a reflective mirror. Thus, a stable and precise fast axis collimation is accomplished.

According to another preferred embodiment each of said slow axis beam shaping means is a reflective parabolic hollow mirror of a shape suited for collimating or focussing an associated output laser beam in slow axis direction. Thus, the high power laser diode array provides a plurality of output laser beams that are collimated both in fast and slow axis.

According to another preferred embodiment several or all of said parabolic hollow mirrors are formed in a common substrate by micro-machining or diamond-machining of said substrate, preferably a copper body, or by press-forming of a glass, which enables an efficient mounting and cooling of the slow axis collimating means.

According to another embodiment, the common substrate is actively cooled, preferably by a fluid flowing through the common substrate, to avoid excessive heating of the common substrate due to reflective and/or absorptive losses caused by said parabolic hollow mirrors.

According to another preferred embodiment, the slow axis beam shaping means is or are configured for collimating said output laser beams in slow axis direction, such that said high power laser diode array provides fast and slow axis collimated output laser beams of a predetermined width in fast axis direction and slow axis direction, respectively, wherein said laser light emitters are displaced relative to each other in fast axis direction and/or slow axis direction by a fraction 1/n of said predetermined width in fast axis direction and/or of said predetermined width in slow axis direction (n being an integer larger than or equal to 1, preferably equal to 2) and wherein said fast and slow axis collimated output laser beams are interleaved in a seamless, chessboard-like manner.

According to another embodiment, the laser light emitters are aligned along at least two rows, at equidistant spacings between two neighbouring laser light emitters of a respective row, wherein neighbouring rows of high power laser diodes are alternately shifted in fast axis direction by a fraction 1/n of said spacing (n being an integer larger than or equal to 1, preferably equal to 2). This optical arrangement enables an efficient interleaving of output laser beams in order to obtain an output laser beam profile consisting of a plurality of output laser beams interleaved in a chessboard-like, seamless manner.

According to another embodiment each of said high power laser diodes emits a plurality of fast and slow axis collimated output laser beams spaced apart from each other, the output fast and slow axis collimated laser beams of two neighbouring rows of high power laser diodes intermeshing in a comb-like manner.

BRIEF DESCRIPTION OF THE DRAWINGS

Hereinafter, the invention will be set forth in exemplary manner and with reference to the accompanying drawings, from which further features, advantages and problems to be solved by the present invention become apparent to a person skilled in the art and wherein:

FIG. 6b shows the beam profile obtained using the first embodiment shown in FIG. 6a;

FIG. 8 shows a modification of the high power laser diode array shown in FIG. 6a, wherein the hollow mirrors are focussing the output laser beams both in slow and fast axis.

Throughout the drawings like reference numerals relate to identical or substantially equivalent elements (components) or groups of elements (components).

DETAILED DESCRIPTION OF PREFERRED EMBODIMENTS OF THE PRESENT INVENTION

With reference to FIG. 4a to 5c the configuration of a high power diode laser for use in a high power laser diode array according to the present invention and the most important steps for manufacturing such a high power diode laser will be described in more detail.

Figure 1A:
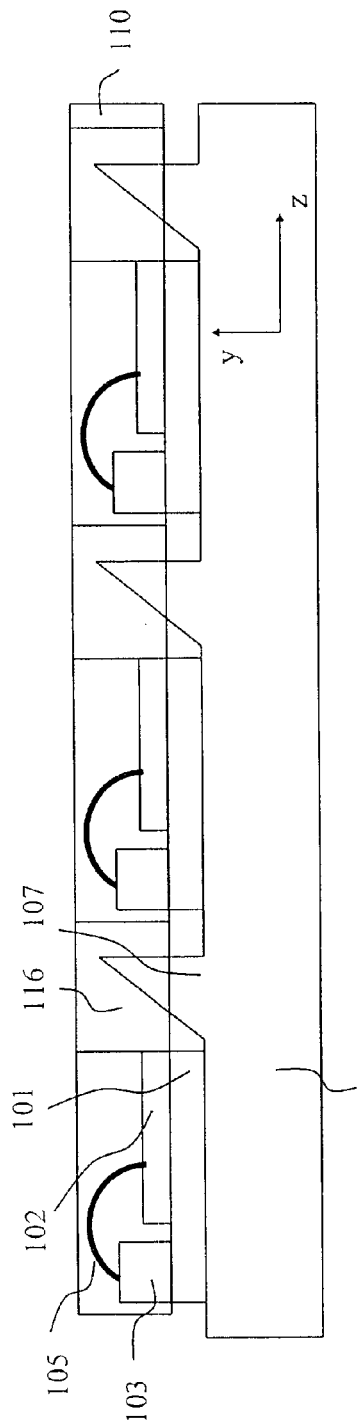
FIGS. 1a and 1b show the mounting of an alignment substrate and the laser diode submounts on a heat sink of an embodiment according to the prior art in a side view and a top view.
Figure 1B:
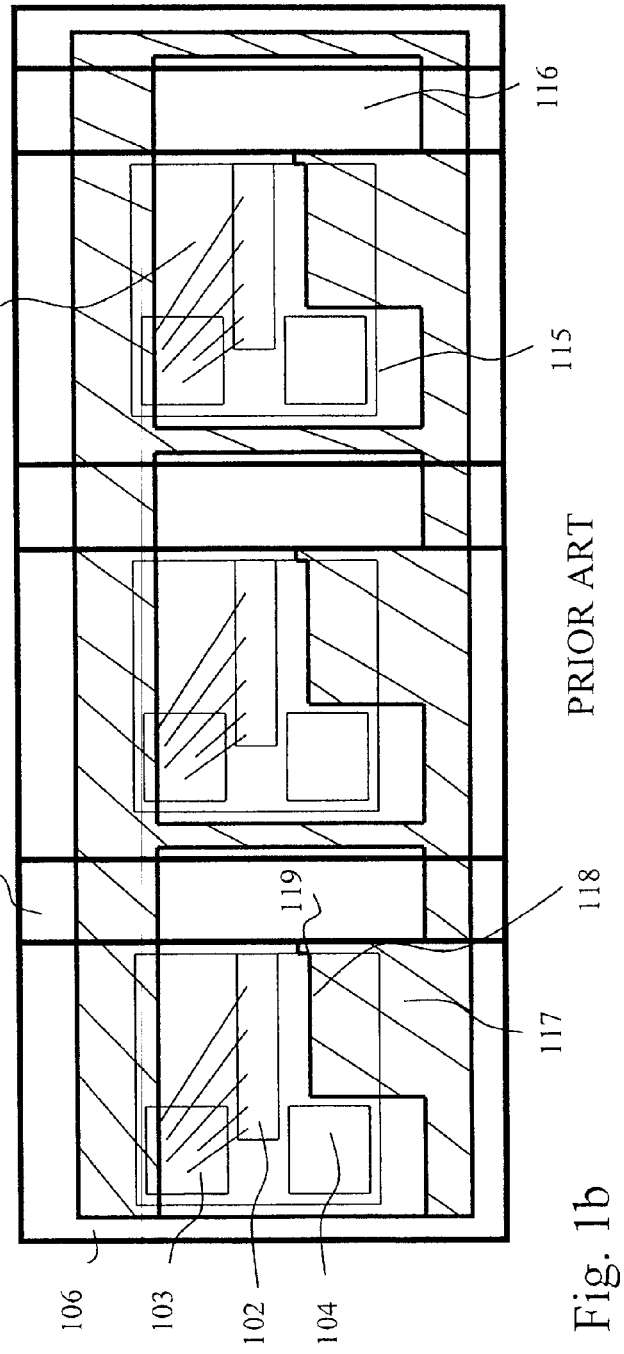
Figure 2A:
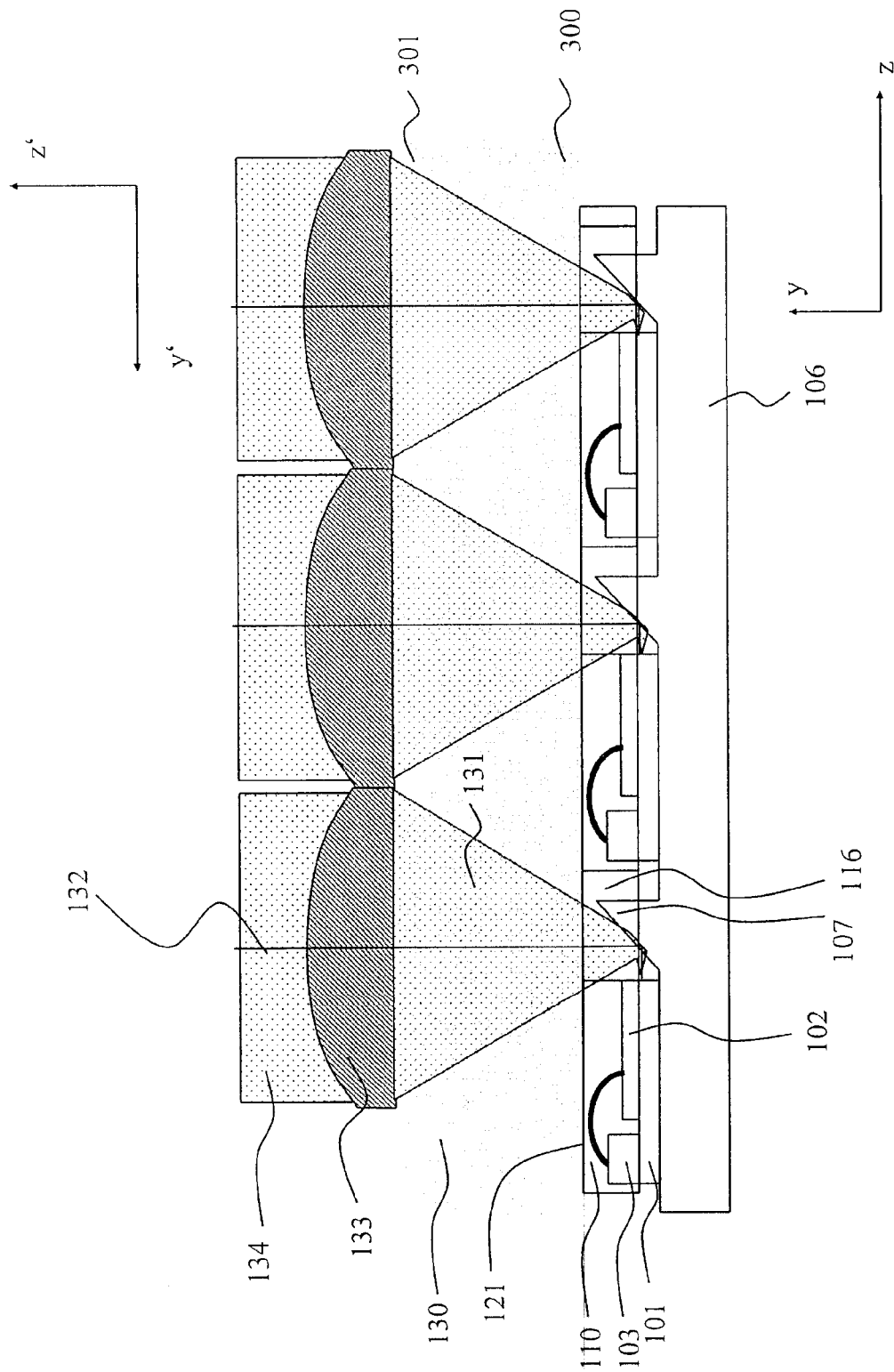
FIGS. 2a and 2b show the embodiment according to FIGS. 1a and 1b with fast axis collimating lenses mounted on the top surface of the spacer substrate in a side view and a top view together with output laser beams; (why take the figure with 100% optical fill factor, FIG. 3a becomes less clear that way)
Figure 2B:
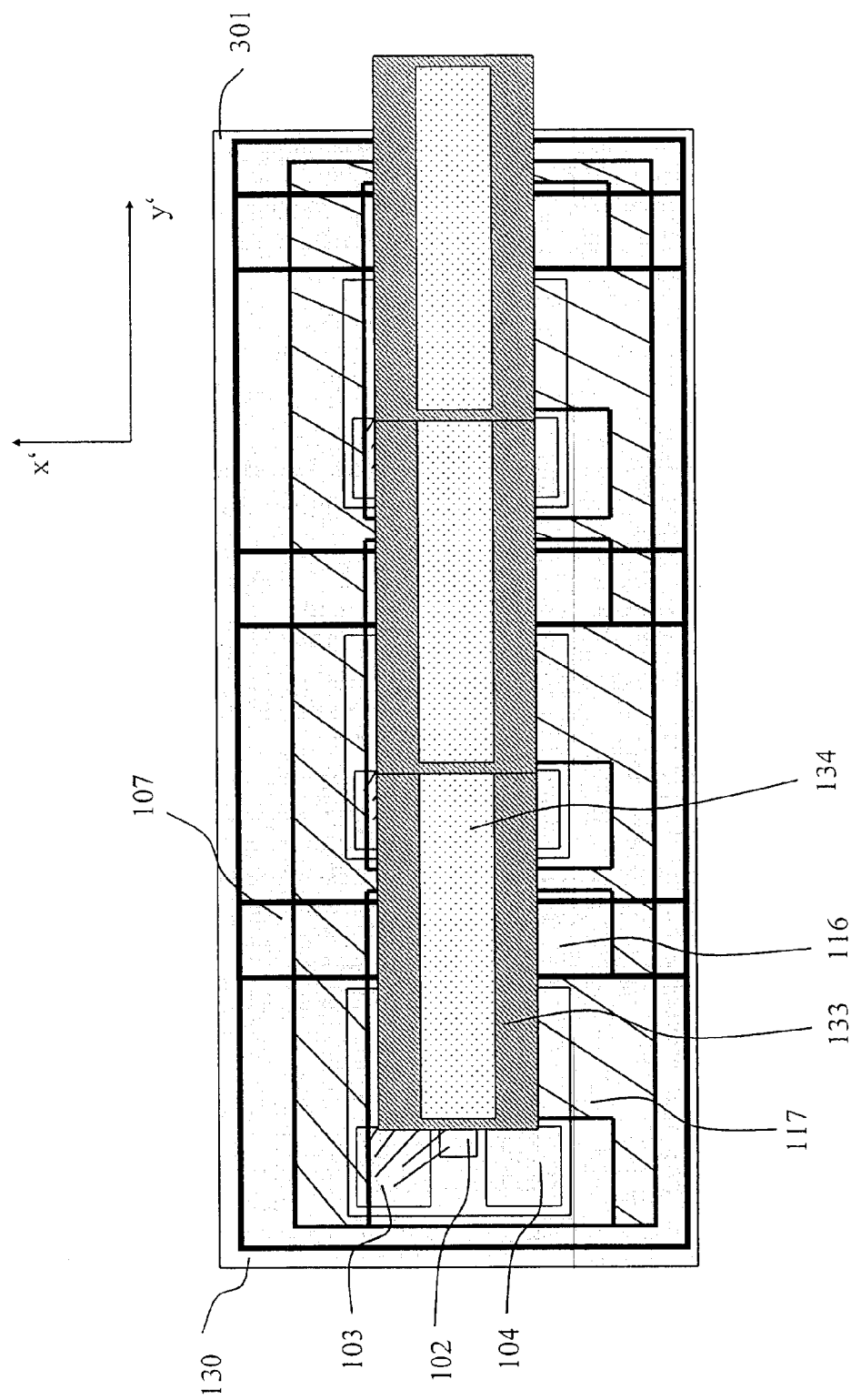
Figure 3A:
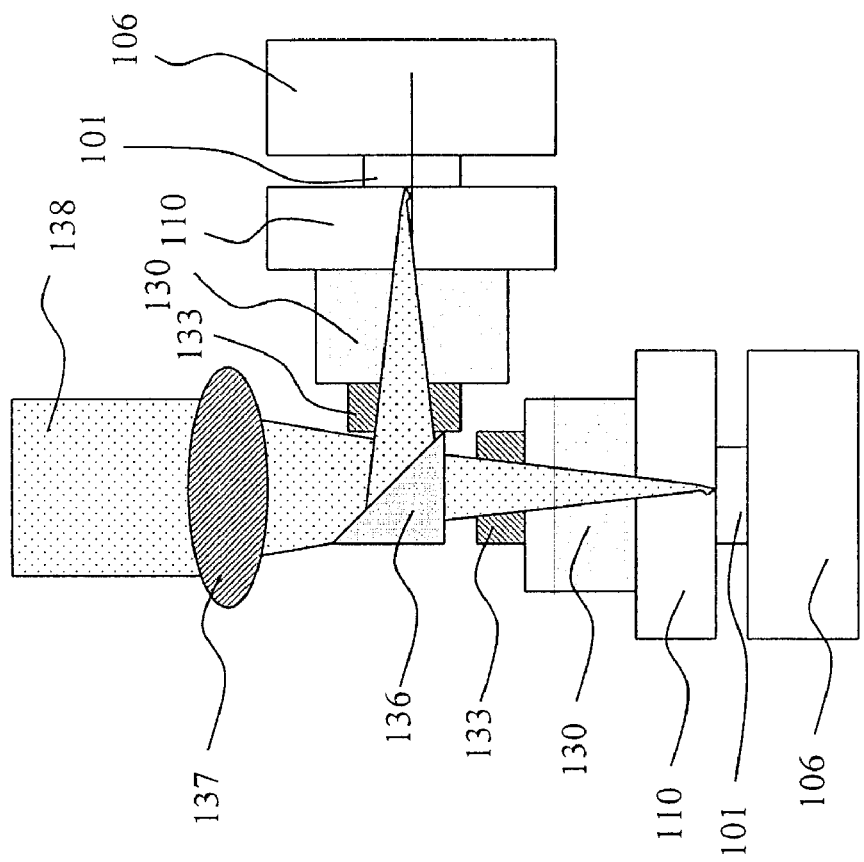
FIG. 3a shows the superposition of two laser beams output by two single laser diodes according to the prior art of a configuration as described with reference to FIG. 2a to 2b.
Figure 4A:
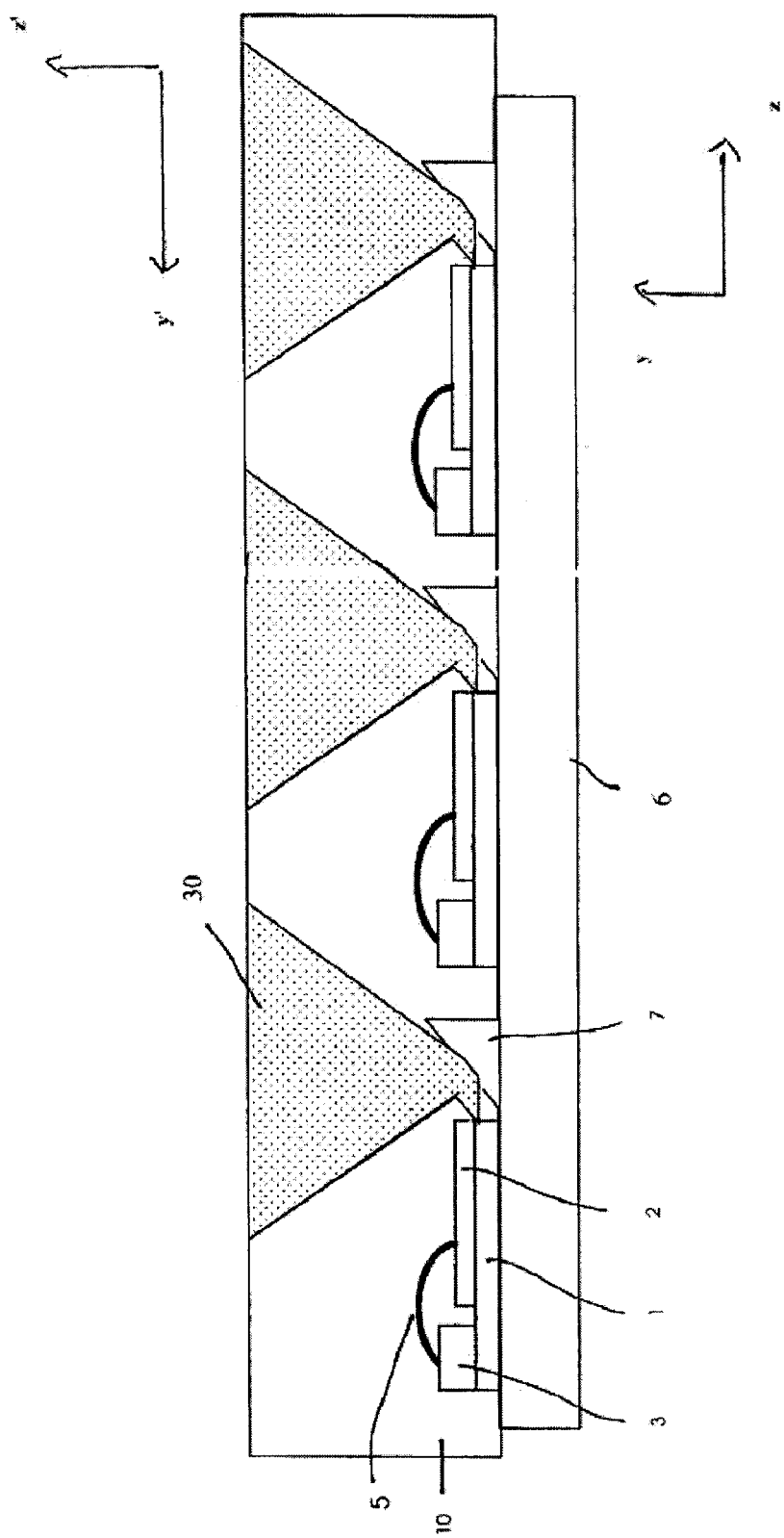
FIGS. 4a and 4b shows the alignment substrate for mounting the laser diode submounts on a common heat sink according to an embodiment of the present invention in a side view and a top view.
Figure 4B:
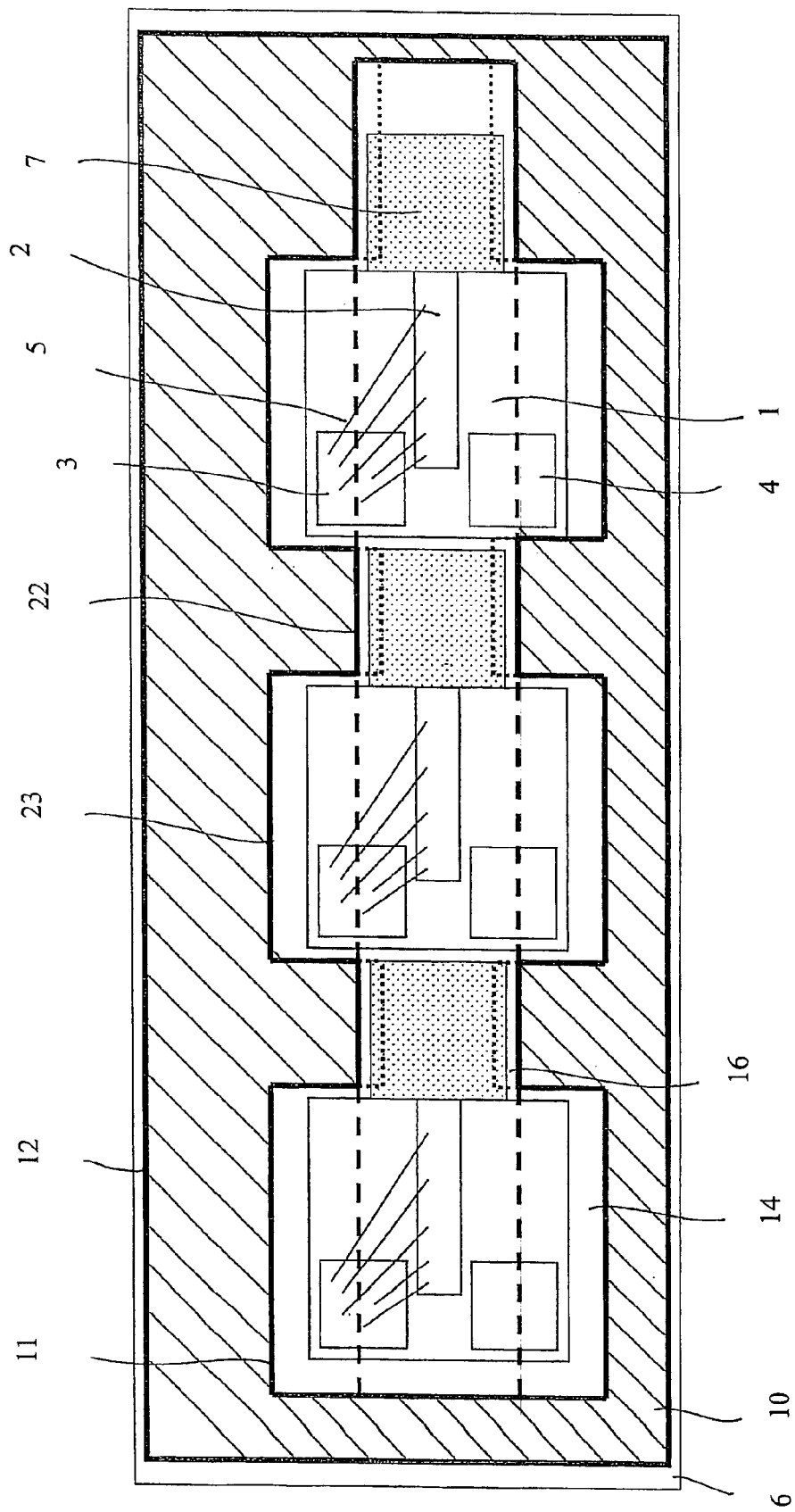

As shown in FIGS. 4a and 4b, the diode laser chip 2 is mounted on the top surface of a submount 1, which is of a substantially rectangular shape having straight edges perpendicular to each other. The submount 1 can be made of any material suitable for supporting a laser diode chip. Preferably the submount is of a high heat conductivity material in order to spread heat generated by the diode laser chip 2 to a carrier 6 supporting the submount 1. Furthermore, the material of the submount 1 preferably has the same coefficient of thermal expansion as the semiconductor material of the diode laser chip. Suitable materials for the submount 1 that shall not be deemed limiting the present invention are: AlN, CuWo or diamond. Typical dimensions of a submount 1 for use according to the present invention are 4 mm by 4 mm.

On the surface of the submount 1 there are provided in a conventional manner bond pads for contacting the diode laser chip 2. More specifically, a bond pad 3 for contacting the n-doped layer of the diode laser chip 2 and a bond pad 4 for contacting the p-doped layer of the diode laser chip 2 are provided. If the submount 1 is conductive, the above p-bond pad is not provided. Bonding wires 5 extend across the gap between the pad 3 and laser diode chip 2 for supplying electric power to the diode laser chip 2. As will be apparent to a person skilled in the art, both the pads 3, 4 and the diode laser chip 2 slightly protrude from the top surface of the submount 1.

As shown in FIG. 4a, the diode laser chip 2 defines a fast axis (y) perpendicular to the direction of propagation (z) of the uncollimated output laser beam 30 and a slow axis (x) perpendicular to the fast axis and direction of beam propagation. The fast axis y is parallel to a plane defined by the pn-junction of the diode laser chip 2. As shown in FIG. 4b, the diode laser chip 2 is mounted in a well-defined orientation on the top surface of the submount 1. More specifically, the front facet of the diode laser chip 2 is substantially flush and parallel with the front edge of the submount 1 and the longitudinal side surface of the diode laser chip 2 is substantially in parallel with an edge of the submount 1. As an alternative, the front facet can also protrude slightly from the front edge of submount 1 or can be disposed at a short distance, and in parallel with, the front edge of submount 1. In order to enable such an alignment of the diode laser chip 2 with regard to edges of the submount 1, stops such as those set forth below may be provided on a surface of the submount 1 so that a proper alignment of the diode laser chip 2 is obtained by abutment of one or more edges of the diode laser chip with an associated stop. Accordingly, in the embodiment according to FIGS. 4a and 4b, the output laser beam 30 is emitted in z-direction which is substantially perpendicular to a front edge of the submount 1 and substantially in parallel with the top surface of the submount 1. As will become apparent to a person skilled in the art, the diode laser chip 2 can also be mounted in any other suitable orientation on submount 2. As will become apparent to a person skilled in the art, the active layers of all diode laser chips lie in a common plane.

As shown in FIG. 4a a planar, i.e. plano-parallel, spacer substrate 10 is mounted on the top surface of the common heat sink 6. As will be shown below in more detail, according to the present invention the spacer 10 serves to support or receive the fast axis collimating lenses used for fast axis collimation of the output laser beams of the diode laser chips in a precise orientation and position in order to obtain a desired fast axis collimation. Based on an individual alignment of the FAC lens, the assembly tolerances for the diode laser are significantly reduced in all three translational axis to tenths of micrometer and for one rotational axis (around slow axis vector) to degrees. As set forth below in more detail, the fast axis collimating lenses are integrated into the high power laser diodes.

The spacer 10 generally is of rectangular shape and has a plurality of cut-outs 14 and 16 in accordance with the total number of laser diode submounts to be mounted. According to FIG. 4b the cut-outs 14 and 16 form a substantially rectangular window. As will be explained in more detail with reference to FIGS. 5a and 5b, the cut-out 16 serves as a window for passing the output laser beam through the spacer substrate and toward downstream fast axis collimating lens, whereas the cut-out 14 serves for accessing the diode laser 2 mounted to a submount 1 and the wire bonds 5 with the respective bond pads 3, 4 (cf. FIG. 4b). Cut-outs 14 and 16 can be of the same width allowing only partial access to the diode laser mounted and bonded to the submount. Furthermore cut-out 16 may comprise a lower recess 11 that is formed such that the fast axis collimating lens rests on the upper surface of the lower recess 11 and is roughly held in position by the sidewalls 22 of the cut-out 16. As will become apparent to a person skilled in the art a cut-out of any other suitable shape may be provided in order to enable alignment of the laser diode chips and/or submounts.

As described in more detail in related application EP 1 830 443 A1 and U.S. Ser. No. 10/778,806 of the applicants, the whole contents of which being hereby incorporated by reference, a precision tooling or the substrate 10 can be used for precisely positioning the laser submounts and/or laser diode chips in the following manner: the central cut-out 14 is limited by a central rectangular protrusion protruding from a right longitudinal web of substrate 10. The top of protrusion serves as an alignment stop for the diode laser chip, as will be explained in more detail below. A small step portion can be provided at the right-hand side of protrusion to thereby form a second alignment stop, perpendicular to alignment stop, as will be explained in more detail below. The height of step portion in transverse direction is smaller than the width of the laser diode chip 2 in slow axis direction, e.g. corresponds to approx. 10%-30% of the total width of the laser diode chip 2 in slow axis direction. Furthermore, the thickness of the substrate 10 can be substantially larger than the height of the laser diode chip in a direction perpendicular to the plane of the pn-junction. Preferably the thickness of the substrate 10 is substantially larger than the height of the bond pads 3, 4 (cf. FIG. 4b) on the top surface of submount 1. Thus, it can be ensured that both the laser diode chip 2 and the bond pads 3, 4 together with the bonding wires 5 are substantially fully received by the cut-outs 14, 16 formed in the lower surface of spacer and alignment substrate 10, when the submounts are mounted to the spacer and alignment substrate 10.

As will become apparent to a person skilled in the art, the spacer can be made of any material suitable to allow precise formation of straight alignment stops having a predetermined orientation. According to a preferred embodiment of the present invention, the spacer will be made of a material identical to that of the heatsink 6 to minimize thermo-mechanical stress and deformation, in particular of copper, in which case the cut-outs and alignment stops can be formed easily and precisely using conventional machining techniques. However, the invention is not limited to use of copper as basic material for the spacer. Other suitable materials not limiting the present invention are glass and ceramics. Some of these materials are suited as well for machining techniques for forming the cut-outs and/or alignment stops with high precision and orientation. As will become apparent to a person skilled in the art, the cut-outs and/or alignment stops can also be produced even at sub-micron precision using other processing techniques, such as laser cutting, micro-machining and the like. It is noted that there is no need for the spacer and alignment substrate to be optically transparent to the output laser light.

FIGS. 4a and 4b show how according to the first embodiment of the present invention the laser diode submounts 1 are mounted to the heatsink 6. As shown in FIGS. 4a and 4b, the submount 1, the bond pads 3, 4 and the laser diode chip 1 are received in the cut-out 14 formed in the spacer 10. Due to the afore-mentioned stops the longitudinal side surface of laser diode chip 2 is substantially parallel to the alignment stop on protrusion or abuts the alignment stop for precisely adjusting the angular orientation of the laser diode chip 2 with respect to substrate 10 in slow axis direction x. Furthermore, according to FIG. 4b, the edge emitting facet of laser diode chip 2 is substantially in parallel with the alignment stop of the step portion used for precisely adjusting both the longitudinal position of laser diode chip 2 with respect to substrate 10 and the angular orientation of the laser diode chip 2 with respect to substrate 10 (y-direction; cf. FIG. 4a). It is noted that the submount 1 can also contact the left longitudinal web. As shown in FIG. 4b, a portion of the left edge of submount 1 does not contact the left longitudinal web 11 of substrate 10 so as to prevent build-up of tensions in submount 1. As shown in FIG. 4a, the bond pads 3, the laser diode chips 2 and the bonding wires 5 are fully received by the cut-outs formed in spacer 10 when the spacer 10 is mounted to heatsink 6. According to another embodiment the laser diode chips are aligned to the submounts as described above. Alignment features provided on the submount and/or on the planar spacer substrate and/or planar alignment substrate enable a corresponding precise alignment as will become apparent to a person skilled in the art.

As shown in FIG. 4a, reflective mirrors 7 are disposed on the upper surface of the heat sink 6 for deflecting the output laser beams upwards by an angle of ninety degrees, i.e. perpendicular to the top surface of the heat sink 6. The mirrors 7 are slanted by 45 degrees with respect the upper surface of heat sink 6. Such slanted portions can be manufactured e.g. by diamond-machining the surface of the mirror 7 and may be coated by a reflective coating e.g. with gold. Preferably, the mirrors 7 are plane mirrors. However, according to alternative embodiments, the mirrors 7 can also have a surface profile for shaping the beam profile of the output laser beams, e.g. the mirrors 7 may be formed as concave or convex hollow mirrors.

In operation the uncollimated output laser beams 30 are deflected by the mirrors 7 from a direction of propagation z by 90 degrees to a direction of propagation z' to thereby pass the cut-out portions 16 of spacer 10 (cf. FIG. 4b). Although not explicitly shown in the schematic drawing according to FIG. 4a, the thickness of the spacer 10 in the direction of propagation z' is substantially larger than the lateral dimensions of the laser diode chips 2. According to the present invention, the thickness of the spacer and alignment plate 30 is of the order of millimeters (mm), a suitable thickness lying in the range between 1 mm and 5 mm and more preferably in the range between 2 mm and 4 mm. Thus, the light cones in the fast axis direction y, y' of the uncollimated output laser beams 30 have opened substantially when reaching the entrance window of the fast axis collimating lenses, which will be described below.

Figure 5A:
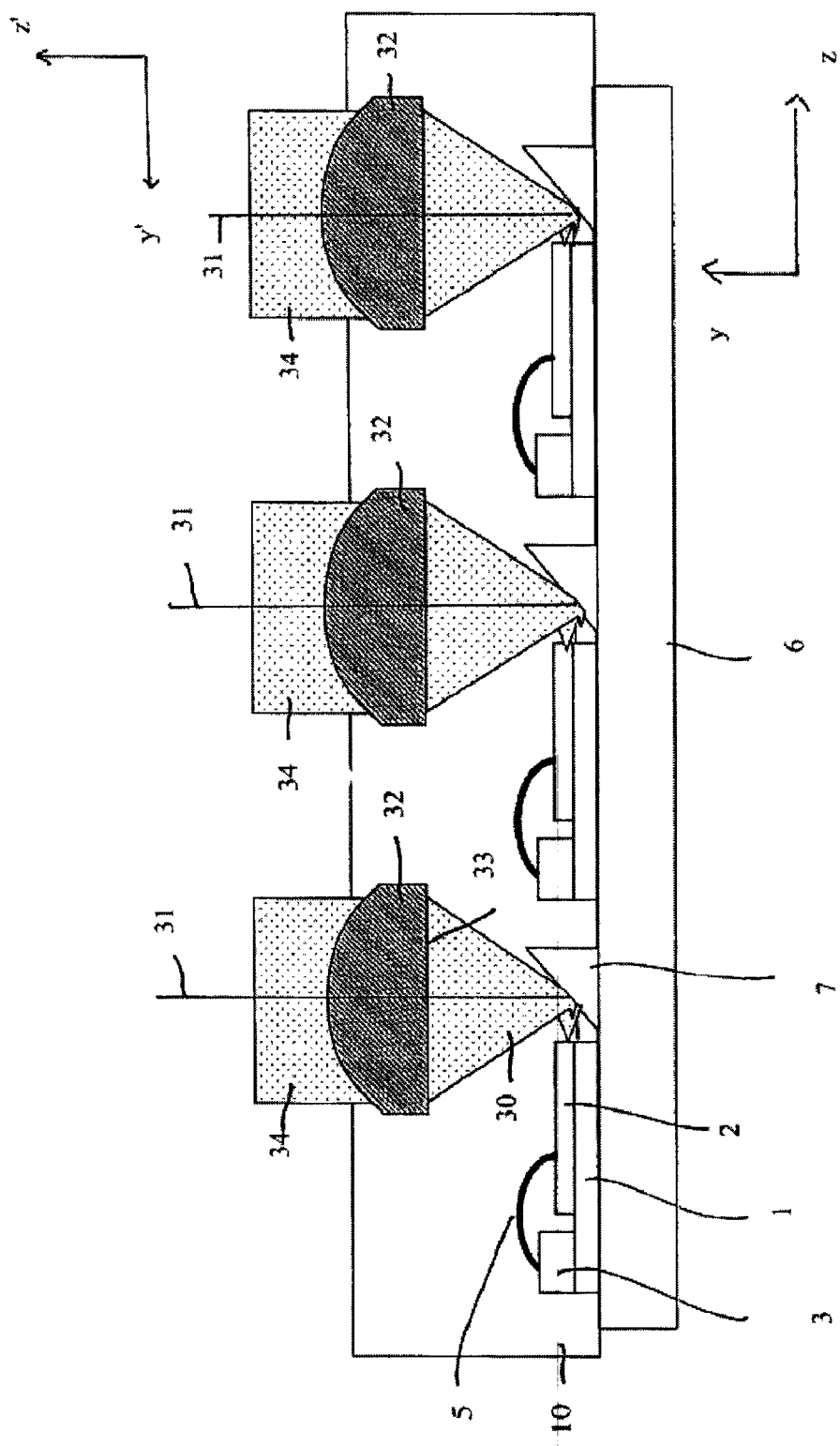
FIGS. 5a and 5b show the embodiment according to FIGS. 4a and 4b with fast axis collimating lenses supported in a planar substrate in a side view and a top view together with output laser beams.

The cut-outs 14 and 16 described above with reference to FIG. 4b extend through the entire height (in z' direction) of the spacer 10 but recesses may be formed in cut-out 16 in the upper surface of the substrate 10, as can be concluded from FIG. 5a. The width of cut-out 14 and 16 may also be of the same width. As shown in the top view of FIG. 4b, in the plane of the substrate 10 this recess is limited by perpendicular sidewalls defining an inner perimeter 11/22 of the substrate 10. More specifically, the inner perimeter 22 defines a region of reduced width so that the uncollimated output beam of the laser diode chips can propagate to the recess unhindered, while the fast axis collimating lens inserted in cut-out 16 may rest on protrusion defining a specific distance to the diode laser and being fixed to either the recess or the sidewalls 22 of cut-out 16.

The central cut-out 14 may also not extend through the entire thickness of spacer 10 in order to further improve the thermal management and heat dissipation, but may be cut through to enable an unhindered access from above to underneath components, such as the submounts 1 and/or laser diode chips 2 during assembly, e.g. for mounting and/or adjusting the position of these components.

As shown in FIG. 4b the two opposing sidewalls 22 of cut-out 16 may form a rectangular bottom surface that protrudes from the perimeter formed by cut-out 16. As will be shown below these rectangular bottom surfaces may serve to support the planar backsides of fast-axis collimating lenses.

As shown in FIG. 5a fast-axis collimating lenses 32 may be supported by the rectangular bottom surface of the recess formed by the two opposing inward protrusions 22. The fast-axis collimating lenses are individual aspheric lenses 32 in this example but can be formed, according to related embodiments, as a lens array having a planar backside. The fast-axis collimating lenses 32 may be supported only at side edges thereof on the rectangular bottom surface of the recess or at the two opposing sidewalls 22, whereas the output laser beams pass the lenses 32 only in the central region thereof. Therefore the beam profile and homogeneity of the output laser beam is not affected by bonding the lenses 32 either at the bottom surface of the recess or at the sidewalls 22 to the spacer 10.

As an alternative to what has been described above with reference to FIGS. 4a and 4b the substrate 10 may also be used only for supporting the fast axis light collimating lenses 32 in an appropriate manner, i.e. not for precisely positioning the laser diode submounts and/or laser diode chips themselves. According to such a preferred embodiment of the present invention, the laser diode submounts and/or laser diode chips are exactly positioned onto the top surface of the common heat sink 6 using a positioning device such as a template or screen for exactly positioning the laser diode submounts and/or the laser diode chips. Afterwards the laser diode submounts and/or laser diode chips are bonded or soldered onto the common heat sink in a single reflow process or the like while being positioned by the positioning device. Individual alignment and soldering of each chip is also possible. After removal of the positioning device the planar substrate 10 is mounted onto the common heat sink 6, which does not require a very precise positioning thereof. Afterwards the fast axis light collimating lenses 32 are mounted on the planar substrate. For this purpose a single rectangular recess suited for at least partially receiving all fast axis collimating lenses 32 or a plurality of recesses each suited for at least partially receiving a single fast axis collimating lens 32 is/are formed in the upper surface of the substrate 10. As an alternative the recess(es) may be formed as a through hole of appropriate shape in the substrate 10.

For mounting the fast axis collimating lenses 32 to the substrate 10, the lenses 32 are inserted from above into the cut-out 16 with optional recesses and then adjusted to ensure a proper beam quality. Displacements of the diode laser in the directions of the fast axis and optical axis are corrected for each diode laser individually through precise alignment in 5 axis to the respective diode laser. Angular misalignment around the slow axis vector are corrected by a respective shift of the fast axis lens in the plane parallel to the mounting surface of submount 2. Translational misalignment of the diode laser in slow axis is corrected by tilting the fast axis lens 32 around the rotated fast axis direction. The fast axis lenses are aligned such that the beams 34 of one high power diode laser are all collimated in fast axis direction with their main axis 31 being all parallel to each other in fast and slow axis direction.

Thus the substrate 10 serves to support the fast axis lenses such that they are precisely adjusted for (a) equal distance between the light emitting facets of the laser diode chips and the entrance window of the fast axis collimating lenses 32 and (b) equal orientation of radiation emitted from all diode lasers. The substrate 10 is designed such that additional optical elements, such as a low reflective window may be attached to the substrate e.g. to seal the fast axis collimated diode laser against ambient conditions.

The fast axis collimating lenses 32 are made e.g. by press-forming or micro-machining a transparent glass substrate or resin or any other suitable method. They can also be diamond machined in copper or by any other method in suitable materials to form a reflective fast axis collimation optical element. The collimating lenses 32 are bonded onto the bottom of the recess or the sidewalls of the cut-out, e.g. using adhesives, fusion bonding, soldering or laser welding.

According to a preferred embodiment of the present invention the fast axis collimating lenses are only bonded to inner side walls 22 of cut-out 16 in substrate 10. For bonding an adhesive, preferable a UV-curing adhesive is filled into the lateral gap 18 (cf. FIG. 5c) between the side surface of lens 32 and the inner side walls 22 of the cut out 16. After appropriate adjustment of position and/or orientation of the lens 32 within the cutout 16, the adhesive is cured, e.g. by UV irradiation. Extensive experiments of the inventors surprisingly revealed that the position and orientation of the lens 32 within the cutout is effected only to a negligible extent during curing. In other words, the position and/or orientation of the lens 32 received at least partially within the cutout 16 of the substrate 10 is not effected to such an extent as to significantly deteriorate the optical quality of the high power laser diode. As can be concluded from FIG. 5a, a plurality of fast-axis collimated light beams 34 is emitted under equidistant spacings in fast axis direction y' by such a high power laser diode, all fast-axis collimated light beams 34 being aligned along a straight line or row. As will become apparent to a person skilled in the art, the fast axis collimating lenses may be spherical or aspherical lenses or any other suitable optical means suited for fast axis collimating the output laser beams of the individual laser light emitters. Preferably, in order to ensure an appropriate collimation of each of the plurality of output laser beams, each fast axis collimating lens is associated to a corresponding laser light emitter and is preferably individually positioned and aligned for each output laser beam.

The heatsinks 6 are cooled either from the side opposite to the side with mounted diode lasers or through cooling channels incorporated into the heatsink. Thus the diode lasers and at least the fast axis collimation lenses can be sealed off against adverse ambient conditions. In order to avoid any thermal effects on the output beam quality, the substrate 10 is preferably made of the same material as the common heat sink 6, such as from copper.

Figure 5B:
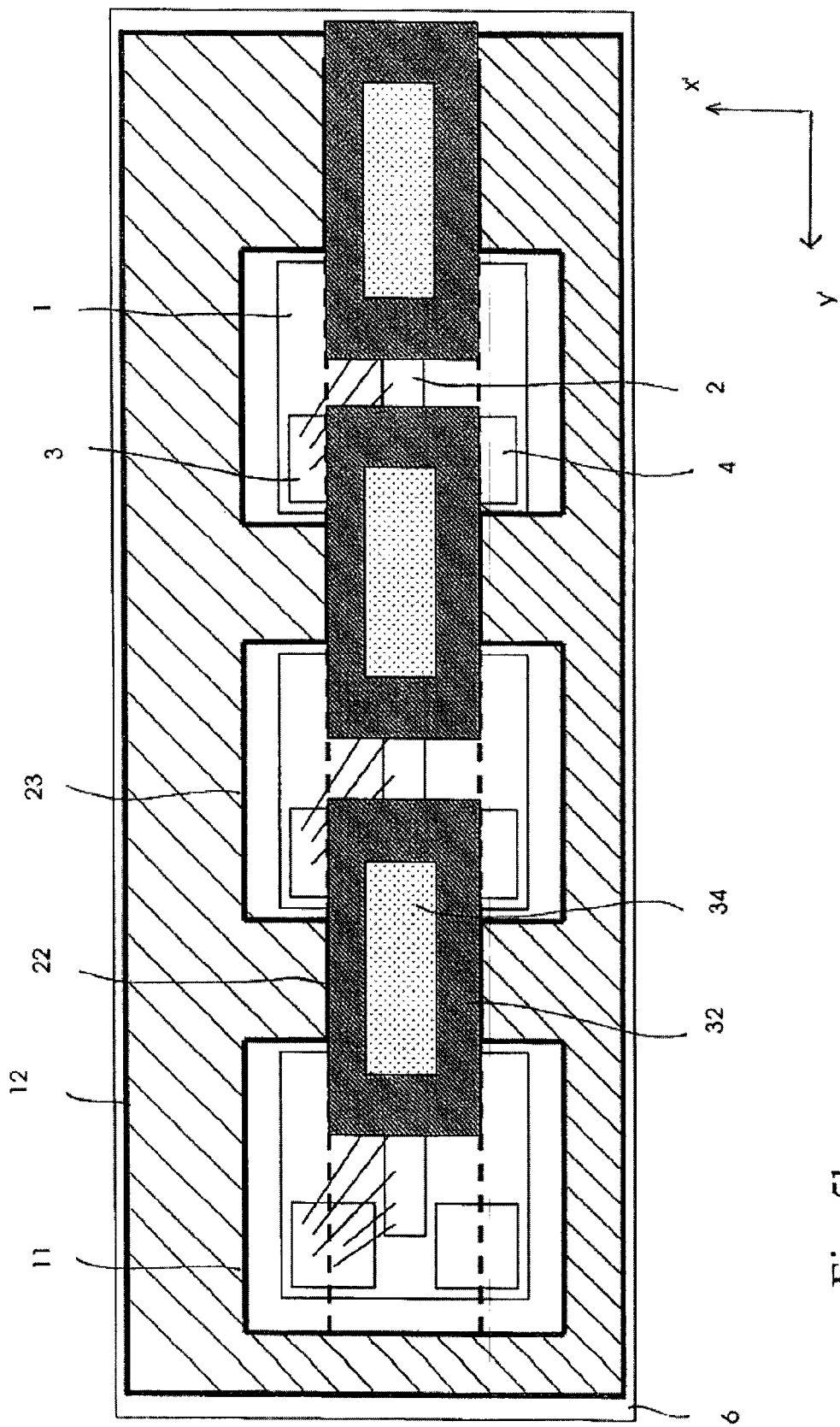

FIG. 5b shows the embodiment of FIG. 5a in a top view. Clearly, the dimension of the output beams 30 of the high power laser diode and it common heatsink 6 in the fast axis direction y' is much larger as than in slow axis direction x' due to the different divergences of the output laser beams in both directions. As can be seen in FIG. 5b, the light cones of the fast axis collimated output laser beams 34 in the fast axis direction y' incompletely fill out the entrance window of the fast-axis collimating lenses 32. In other words: the fill rate of the collimated output laser beams 34 in the fast axis direction y' when exiting the lenses 32 is almost 50%. As will become apparent to a person skilled in the art, this fill rate is substantially given by the design and position of the fast axis lens 32 in the direction of beam propagation z' and can be easily adjusted in the range between e.g. 10% and substantially 100%. As a high fill rate might cause problems with beam adjustment and beam distortion in the collimated beam 34, according to preferred embodiments of the present invention the fill rate is adjusted to approx. 50% or 33%, i.e. a fraction 1/n with n being an integer. A fill rate of 100% is achievable without any additional beam deflecting optics by properly arranging the diode laser as described below.

As mentioned above, according to a preferred embodiment the high power laser diode according to the present invention is mounted in the following manner. In a first step, the laser submounts 1 with the bond pads 3, 4 and the laser diode chip 2 mounted thereon are positioned on the top surface of the common heat sink 6. The laser diode chip 2 may not yet be firmly connected with the top surface of submount 1 so that its position and angular orientation with respect to submount 1 can still be varied. As a next step, the spacer and alignment substrate 10 is positioned on the top surface of the common heat sink 6 in a fixed position, e.g. using an intermediate clamping or other intermediate fixation technique. Afterwards, the laser diode chips 2 and/or submounts 1 are aligned by abutment to at least one stop of the spacer and alignment substrate 10. Afterwards, in a single step the submounts 1 and/or the laser diode chips 2 and the spacer and alignment substrate 10 are fixed to the common heat sink 6, e.g. by soldering. In this step care should be taken to ensure that the previously aligned positions of the heat sinks and/or laser diode chips do not change. After this step the laser diode chips 2 are positioned on the submounts 1 such that the longitudinal side edge thereof is in parallel with the stop 18 on top of protrusion 17 and that the front facets are in parallel with the stop provided by the step portion 19 to thereby align the laser diode chip 2 in fast axis and slow axis direction.

Alternatively, a precision tooling is used instead of the spacer and alignment substrate 10, to position the laser diodes chip 2 and submounts 1 relative to the common heatsink 6 during the reflow soldering process of bonding the laser diode chips 2 to submounts 1 and/or bonding the submounts 1 with attached laser diode chips 2 to the common heatsink 6. The tooling may incorporate means, such as springs, to firmly press the submounts and/or chips against alignment stops in slow (x) and fast axis (z) direction thus defining the position of the laser diode chip as well as one angle with its vector parallel in y direction. An additional force may also be applied on the top surface of the submount 1 or laser diode chip 2. to minimize the rotational misalignments of the these components with the vectors parallel to x and y direction. The rotational misalignment with its vector parallel to z is critical for further beam shaping, since it cannot be compensated for by precise alignment of the fast axis collimation lens 32. After bonding/soldering the precision tooling is removed and the spacer substrate 10 is attached to the common heatsink 6 in a separate bonding process by means of soldering or gluing or the like. It is understood to a person skilled in the art, that the soldering/bonding process of the submounts and/or laser diode chips may be augmented by self centering, enabled through proper selection of the solder and the respective soldering process.

As will become apparent to a person skilled in the art, the laser diode chip 2 is bonded onto the top surface of submount 1 using well-known soldering techniques. The conditions during soldering are such that the orientation and alignment of the laser diode chip 2, as determined by abutment to the stops as outlined above, remains substantially unchanged.

As will become apparent to a person skilled in the art, as an alternative at least one of the above stops may alternatively be disposed directly on the top surface of the submount, for properly aligning the diode laser chip with respect to the edges of the submount. According to that alternative embodiment, the same or other stops on the top side surface of the submount interact with the edges of the cut-outs of the spacer and alignment substrate that must then be properly and differently located in order to properly align the submount with respect to the spacer and alignment substrate.

As a next step, the fast-axis collimating lenses are inserted into the cutouts 16 of the spacer and alignment substrate 10, adjusted and positioned properly and then bonded, at side edges thereof as set forth above.

The high power laser diode assembled in such a manner will emit a plurality of fast-axis collimated output laser beams 34 that propagate in parallel with each other along the optical axes 31 (cf. FIG. 5a). Due to the alignment of the laser diode chips along a single row, all output laser beams 34 are aligned in one plane defined by the main axis of all individual beams and are all parallel to each other pointing in the direction z' (cf. FIG. 5a). The pitch between neighbouring output laser beams 34 is given by the pitch between neighbouring laser diode chips in direction y'.

Figure 5C:
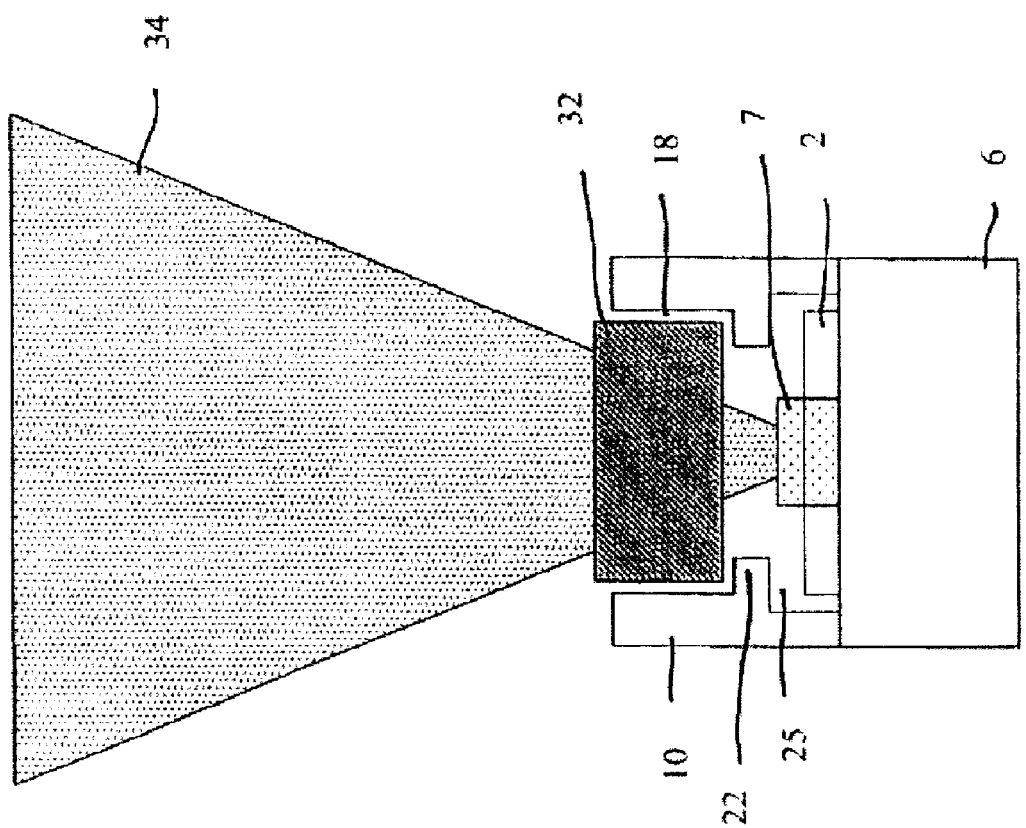
FIG. 5c shows the embodiment according to FIGS. 4a and 4b in a top view onto the end face of the high power laser diode and along the direction of alignment of the laser diodes of this high power laser diode.

FIG. 5c shows the embodiment according to FIGS. 4a and 4b in a top view onto the end face of the high power laser diode and along the direction of alignment of the laser diodes of this high power laser diode. As shown in FIG. 5c a recess 25 is formed in a bottom level of spacer 10. The top surface of the laser diode chips (not shown) is almost at the level of the upper surface of the recess 25 so that the output laser beam 34 is emitted at the level of inward protrusion of substrate 10. An upper recess is formed in the surface of substrate 10 that does not extend up to the bottom surface of substrate 10. The inward protrusion prevents that the lens 32 mistakenly falls onto the laser diode. However, according to the present invention the inward protrusion is preferably not used as a support for the rear side of lens 32.

Figure 5D:
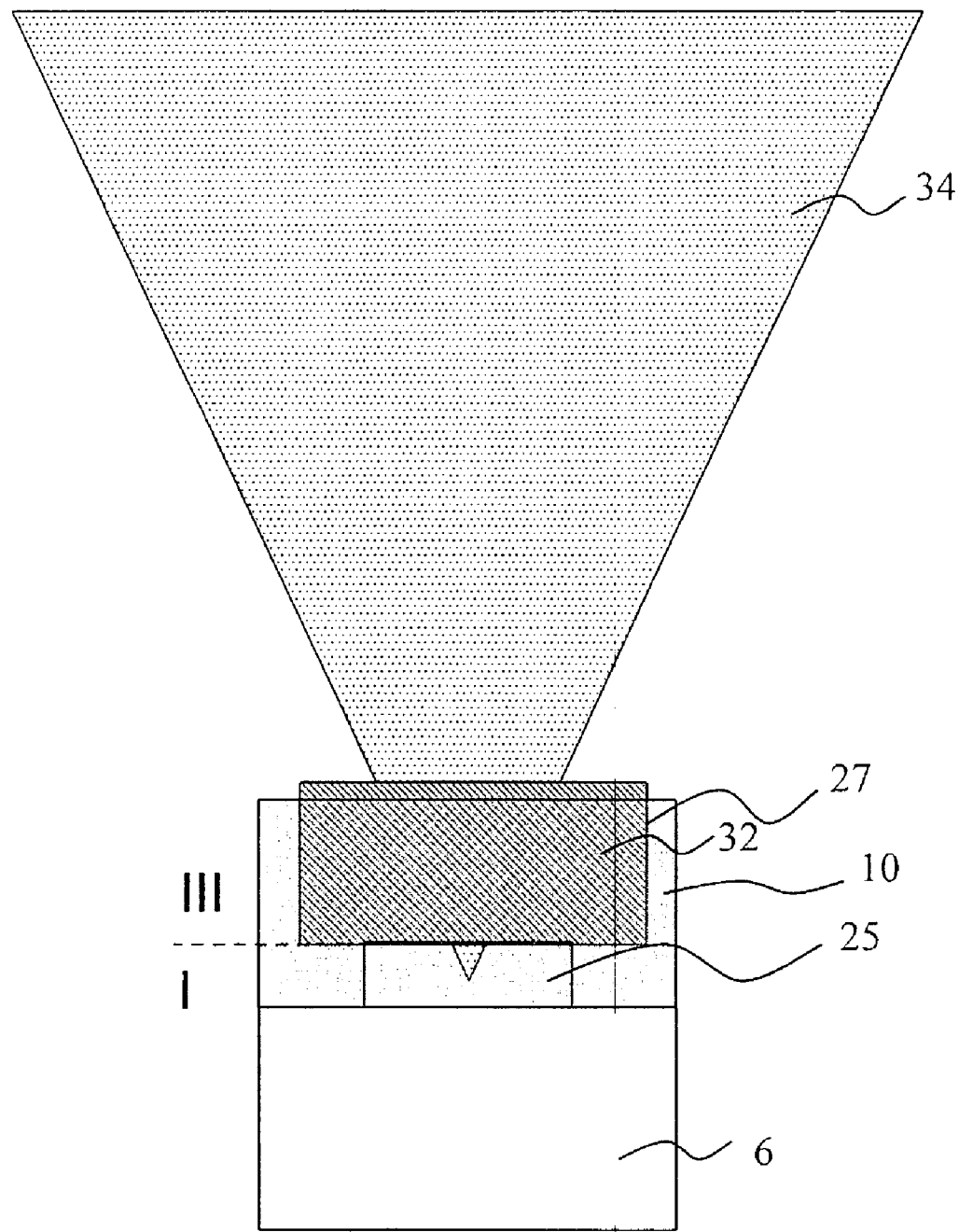
FIG. 5d shows a modification of the embodiment shown in FIG. 5c having a unitary planar substrate for supporting the fast axis light collimating lenses.

FIG. 5d shows a further modification where the spacer 10 is still a one-piece member. But, according to FIG. 5d the recess 25 extends up to the backside of the fast-axis collimating lenses 32. However, preferably also according to this embodiment the lens 32 is not supported by the step in the side walls of substrate 10 but is directly bonded to inner side walls of the upper recess.

Figure 5E:
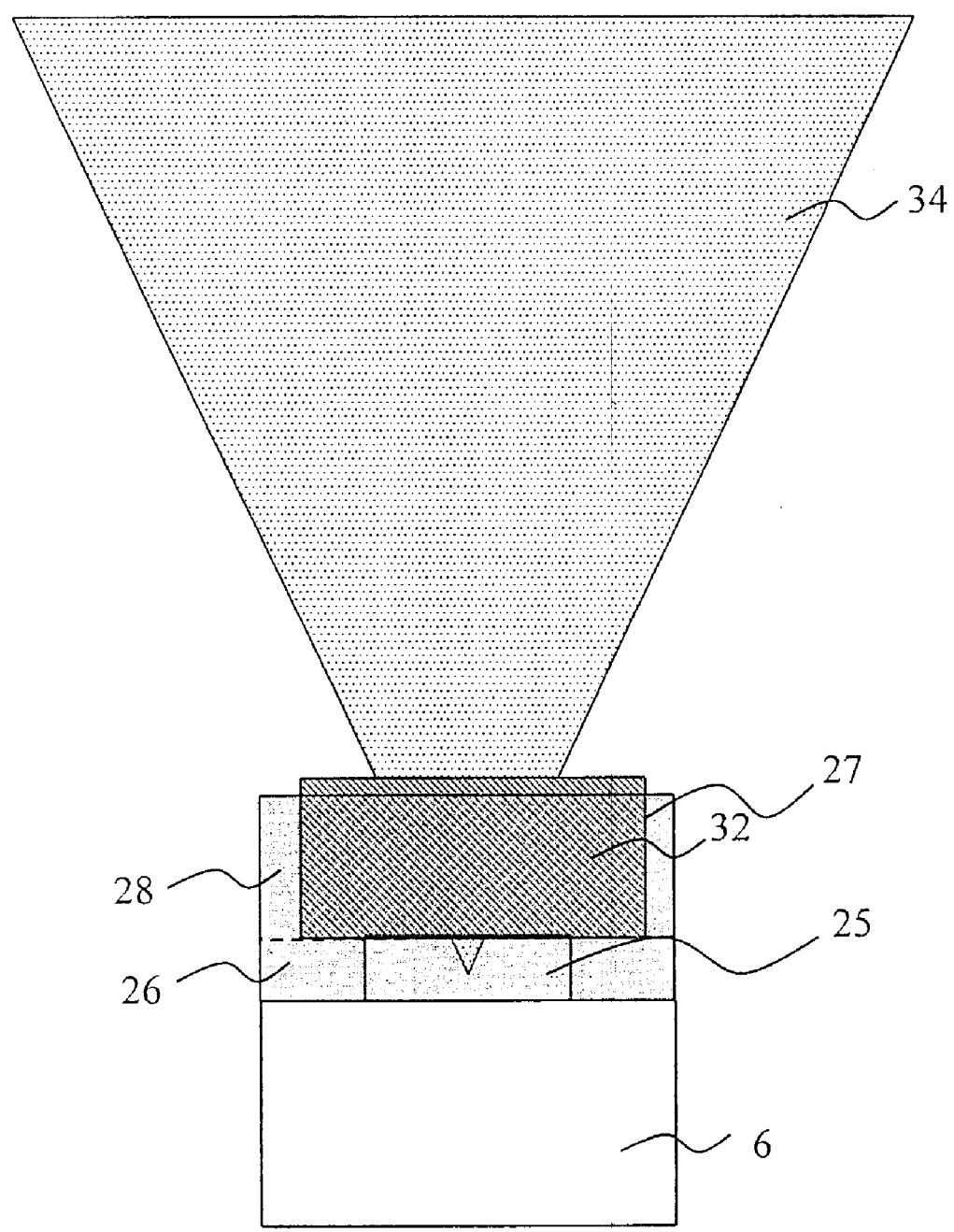
FIG. 5e shows a modification of the embodiment shown in FIG. 5c having a planar substrate consisting of a lower and upper planar substrate.

FIG. 5e shows a further modification, where the spacer and alignment substrate 10 is a layered two-piece member consisting of a plane-parallel upper substrate 28 and a plane-parallel lower substrate 26 that are connected with each other, preferably by bonding.

Figure 5F:
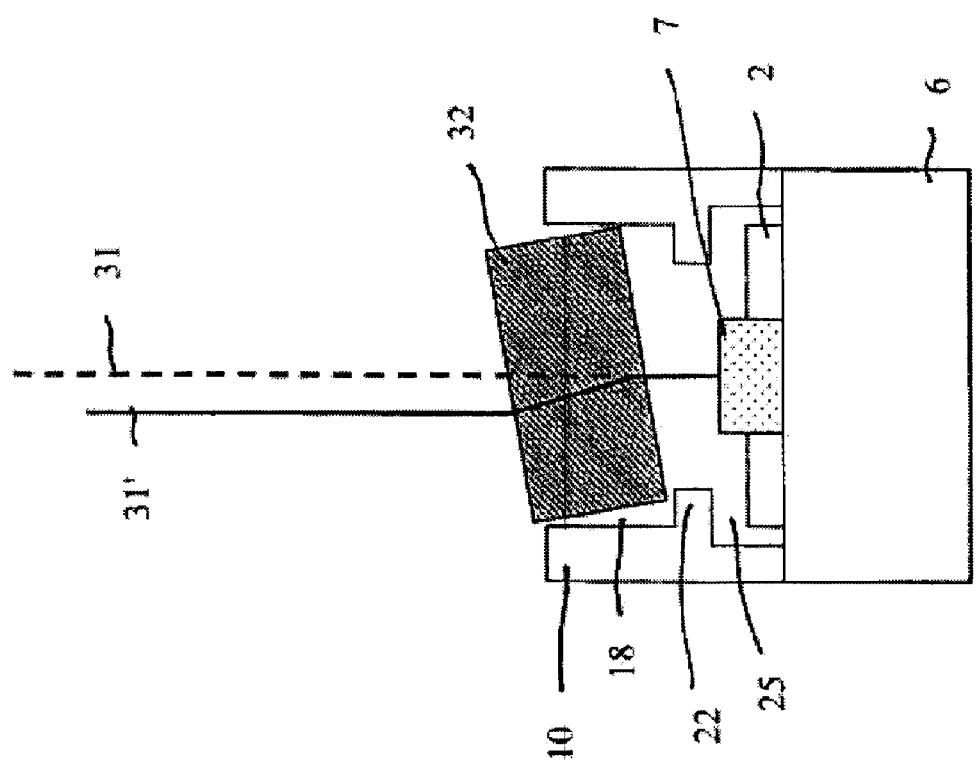
FIG. 5f shows a modification of the embodiment shown in FIG. 5c, wherein the fast axis collimating lens is tilted in order to obtain a lateral beam shift for adjusting the position of an associated output light beam collimated in fast axis direction.

FIG. 5f shows the effect of tilting the fast-axis collimating lens 32 within the recess formed in the upper surface of substrate 10. To that extent, the lens 32 may be considered as a glass plate that, if tilted about the optical axis 31, results in a lateral shift of the transmitted light beam to a shifted position 31' with a minor impact on beam quality of the collimated beam, the lateral shift being determined by the refractive index of the glass, the tilt angle and the thickness of the glass plate in propagation direction. Thus, according to the present invention by tilting the fast-axis collimating lens 32 within the recess formed in the upper surface of substrate 10 about one axis with its vector parallel to y' misalignments of the laser diode chip position in slow axis direction (x direction) can be compensated. Angular alignment around the other two orthogonal axes as well as the two orthogonal translational axis (y mad z) must be carried out to adjust the optical axis 31 of the fast-axis collimated laser beams to obtain a precise alignment of all output fast-axis collimated laser beams 34 (cf. 5a) along a straight line (row) under equidistant spacings in fast axis direction.

As will become apparent to a person skilled in the art, instead of precisely aligning the fast axis lens alternatively the fast axis lens can be fixed and the associated laser diode can be aligned.

As will become apparent to a person skilled in the art the substrate 10 cannot only receive the fast axis collimating lens, but can also receive or support a cover glass used for sealing the high power laser diode array according to the present invention. Furthermore, the substrate can be configured for receiving further optical components, such as volume holographic gratings or similar optical components for further beam conditioning.

For an optimum adjustment and performance it is important that the coefficient of thermal expansion of the common heatsink and of the fast axis collimating lens holder are identical to minimize misalignment of the fast axis collimating lens with regard to the associated laser diode for varying thermal loads.

Figure 5G:
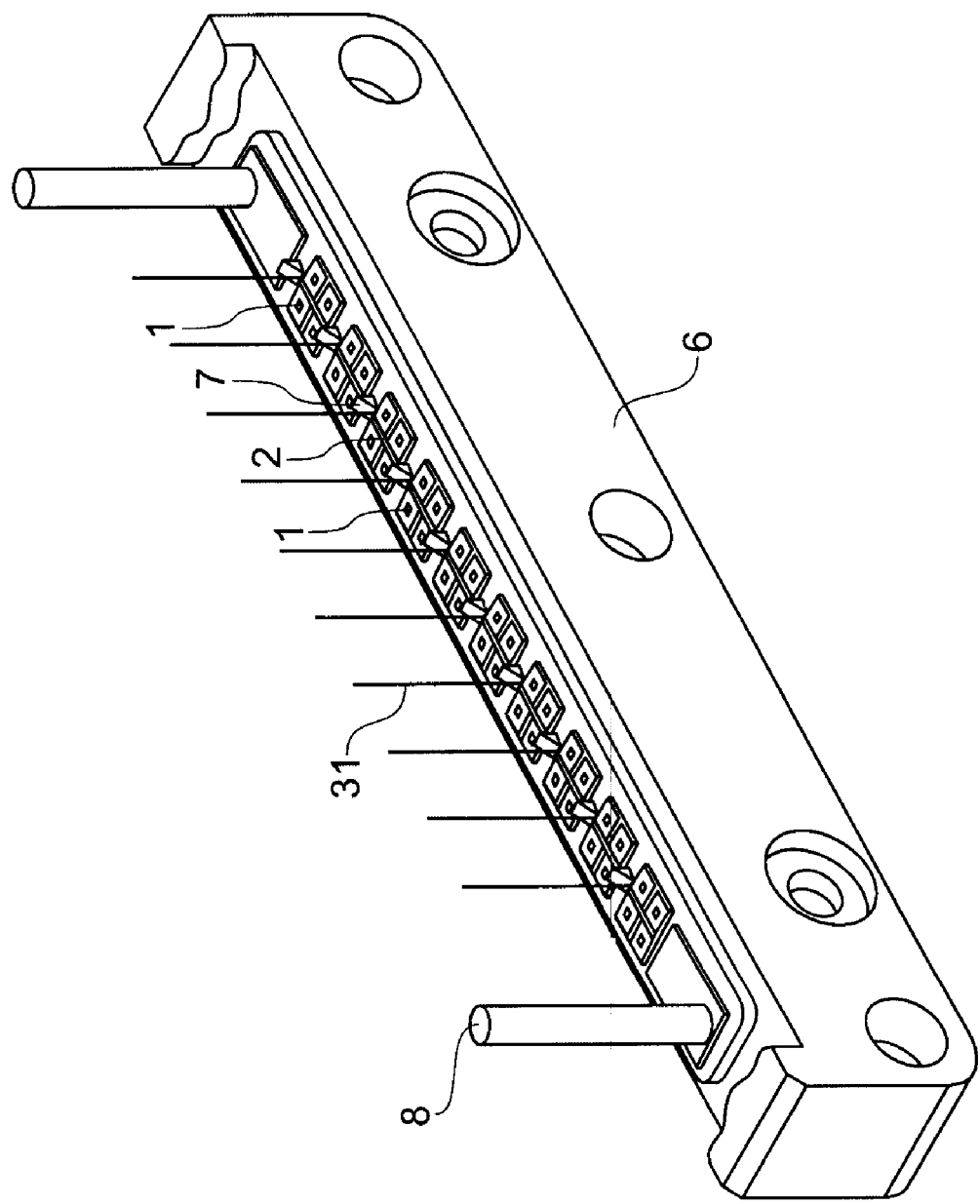
FIG. 5g shows in a perspective top view the common heat sink with integrated beam bending mirrors of a high power laser diode according to the present invention with a plurality of light emitters disposed on an upper surface thereof and aligned along a single row or line.

FIG. 5g shows a perspective view onto the common heat sink 6 of a high power laser diode according to the present invention. A plurality of laser diode submounts 1 with laser diode chips 2 mounted thereon are disposed under equidistant spacings in fast axis direction and under alignment along a straight line (row). The mirrors 7 disposed on the top surface of the heat sink 6 deflect the output laser beams 31 by 90 degrees upwards.

Figure 5H:
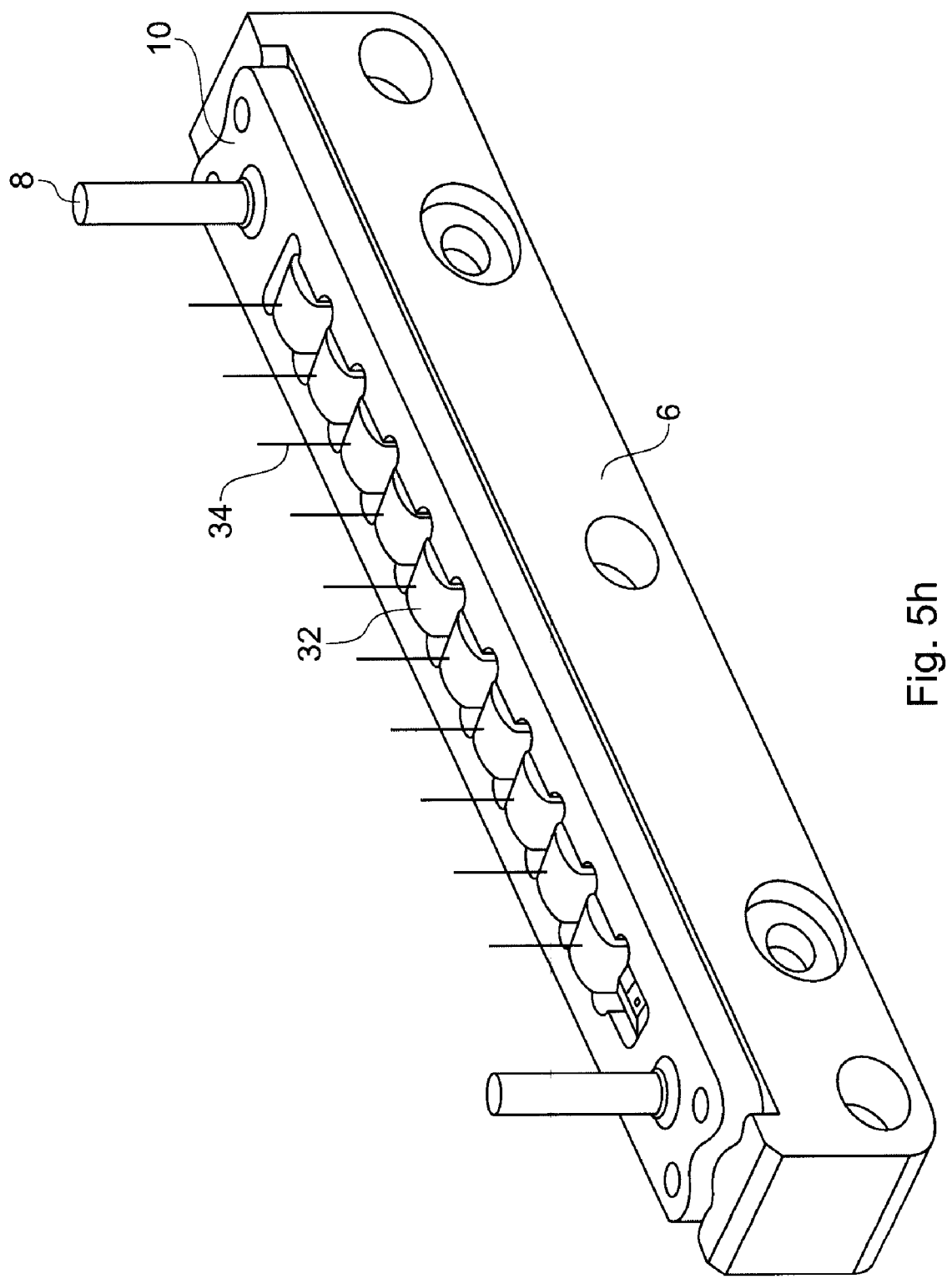
FIG. 5h shows the high power laser diode according to FIG. 5g with a planar substrate mounted on a surface of the common heat sink for holding a plurality of cylindrical, aspheric lenses for fast axis collimation.

FIG. 5h shows the high power laser diode according to FIG. 5g, with the planar substrate 10 mounted thereon, a plurality of cylindrical fast-axis collimating lenses 32 being partially received in a single rectangular recess in the upper surface of substrate 10. Reference numeral 34 denotes the fast-axis collimated output laser beams and reference numeral 8 refers to the electrical contacts of all laser diode chips 1.

FIG. 6a to 6f show various embodiments of high power laser diode arrays according to the present invention including different optical assemblies for slow axis collimation or focusing of linear high power laser diodes disposed in parallel with each other under a predetermined pitch. In these drawings the high power laser diodes are shown in a top view onto the end face of the high power laser diode and along the direction of alignment of the laser diodes of this high power laser diode.

Figure 6A:
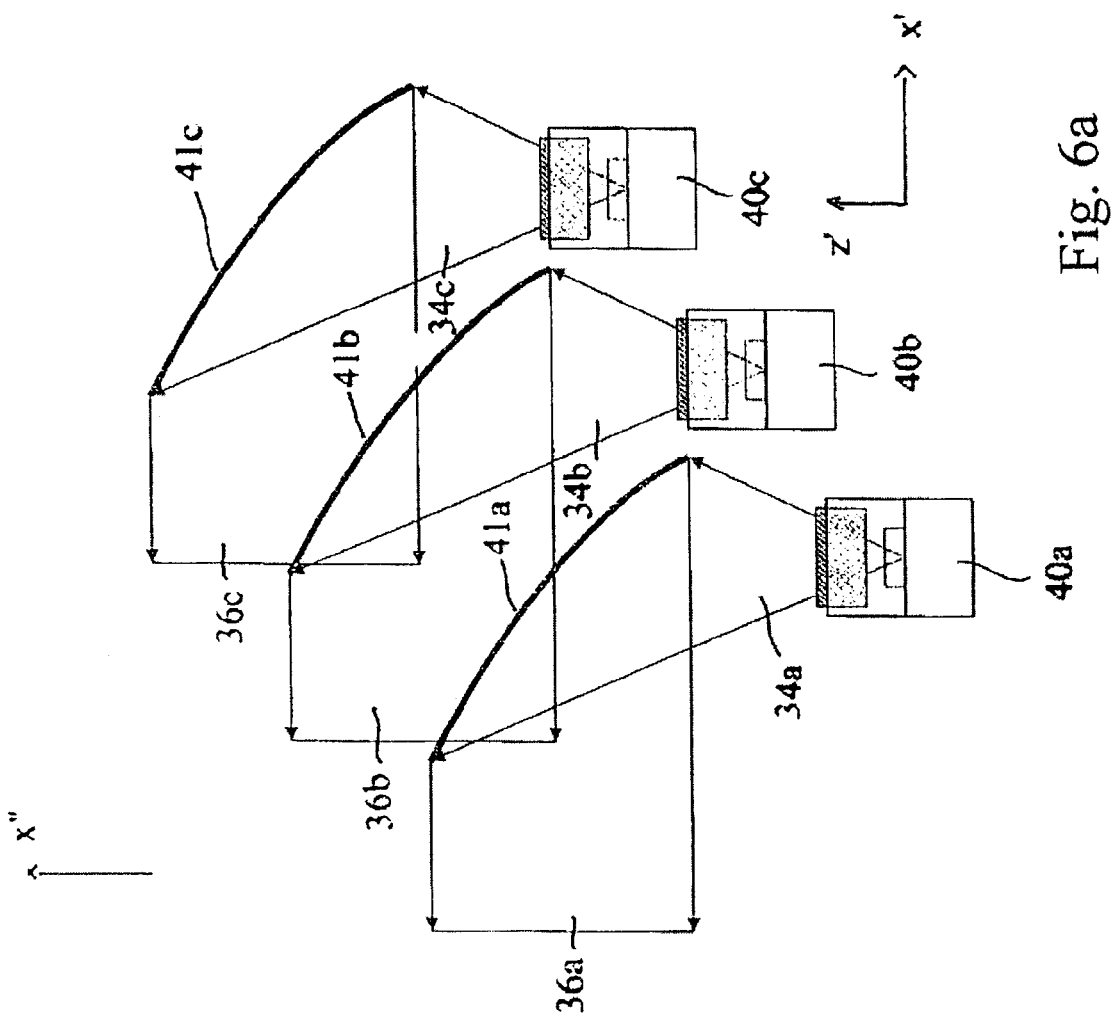
FIG. 6a shows a high power laser diode array according to a first embodiment of the present invention for slow axis collimation of three linear high power laser diodes disposed in parallel with each other under a predetermined pitch in two axes.
Figure 6B:
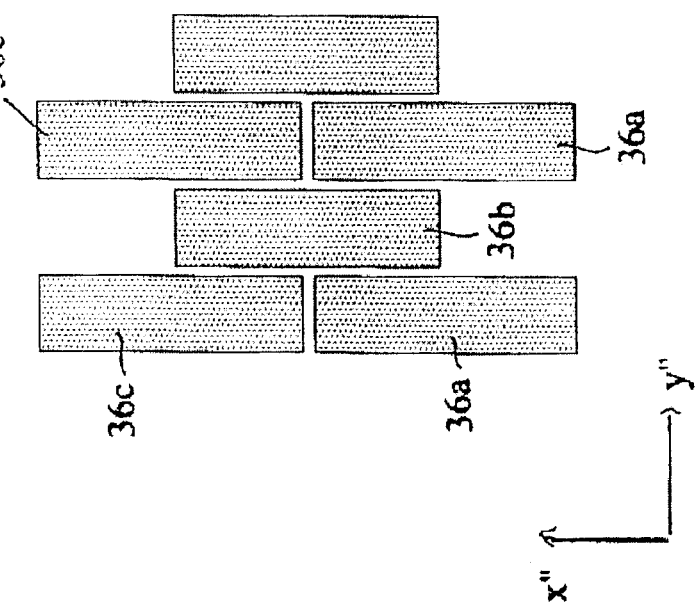

As shown in FIG. 6a, the fast-axis collimated output laser beams 34a-34c generated by the high power laser diodes 40a-40c as described above are deflected by associated parabolic hollow mirrors 41a-41c. In this arrangement the distance from the center of each parabolic mirror 41a-41c to the respective diode laser of the laser diode 40a-40c is identical for all diode lasers 40a-40c. The curvature of these mirrors 41a-41c is such that a slow-axis collimation of the output laser beams 34a-34c is achieved in slow axis so that the deflected output laser beams 36a-36c are collimated in both fast and slow axis direction. In other words: the respective laser light emitters of the laser diodes 40a-40c are disposed at the focus of a respective parabolic hollow mirror 41a-41c. Further, the mirrors 41a-41c and the high power laser diodes 40a-40c are disposed in an interleaved, chess-board like manner so that the deflected output laser beams 36a-36c are interleaved in a substantially seamless manner, as indicated by the resulting schematic beam profile shown in FIG. 6b. As the individual output laser beams 36a-36c are substantially collimated in both fast axis and slow axis direction at preferably identical divergence angles in slow and fast axis direction, the resulting beam profile shown in FIG. 6b exhibits a substantially homogenous intensity distribution for all encircled beams with almost 100% fill factor without the need for any (micro-) optical components as commonly used in the prior art for rearranging the beams of state-of-the-art diode lasers.

According to FIG. 6a three high power laser diodes 40a-40c as described above are disposed in parallel with each other and under predetermined non-vanishing distances between neighbouring high power laser diodes 40a-40c in three directions. More specifically, in FIG. 6a the laser diodes 40a-40c are shifted in three directions, namely in two directions (x', z') perpendicular to the direction of beam propagation (z') after deflection at the mirror disposed on the laser diode substrate (cf. e.g. FIG. 5g) and after fast-axis collimation and in one direction (y') parallel to the direction of beam propagation of the fast-axis collimated output laser beams 34a-34c after deflection at the mirror disposed on the laser diode substrate.

In the following it is assumed that the fill rate in fast axis direction (y') is 50%, which means that the fast-axis collimated output laser beams, which are emitted at equidistant spacing and together form a comb-like pattern, if viewed in cross-section of the laser light beams, fill 50% of a rectangular stripe extending in fast axis direction. Based on such a fill rate of 50% in fast axis direction (y'=y") in this exemplary embodiment, neighbouring rows of high power diode lasers 40a-40c are shifted (a) in fast axis (y'=y") direction by half a pitch, i.e. by half the distance between neighbouring laser light emitters of a laser diode 40a-40c, (b) in slow axis (x') direction (before and after beam deflection at the mirrors disposed on the laser substrate) by half the beam width of the slow axis collimated beam 36a-36c and (c) in direction of the optical axis after beam deflection at the mirrors disposed on the laser substrate (z') for constant distance to the respective parabolic hollow mirror 41a-41a serving as a slow axis collimator.

This arrangement of diode lasers and collimation lenses results in a fill rate of 100% in both fast and slow axis direction with no additional optics to change the direction or position of individual beams as in the prior art.

It is apparent to the expert that other shifts and other fill rates can be achieved with different shifts.

It will become apparent to a person skilled in the art that by an appropriate arrangement and configuration of the mirrors 41a-41c and the high power laser diodes 40a-40c it is possible to obtain a beam profile of an arbitrary shape, e.g. line-shaped, rectangular, circular, elliptical, star-shaped. This effect can be used to efficiently image and couple the output laser beam to other optical components, such as optical fibres, laser rods (for optical pumping of secondary laser sources) or any sort of optical medium.

As will become apparent to a person skilled in the art the high power laser diodes 40a-40c shown in FIG. 6a may be disposed on a single substrate, e.g. a common heat sink, that may be planar or may have a stepped profile (as described below referring to FIG. 7) in order to achieve the pitch between neighbouring high power laser diodes 40a-40c as shown in FIG. 6a.

Figure 6C:
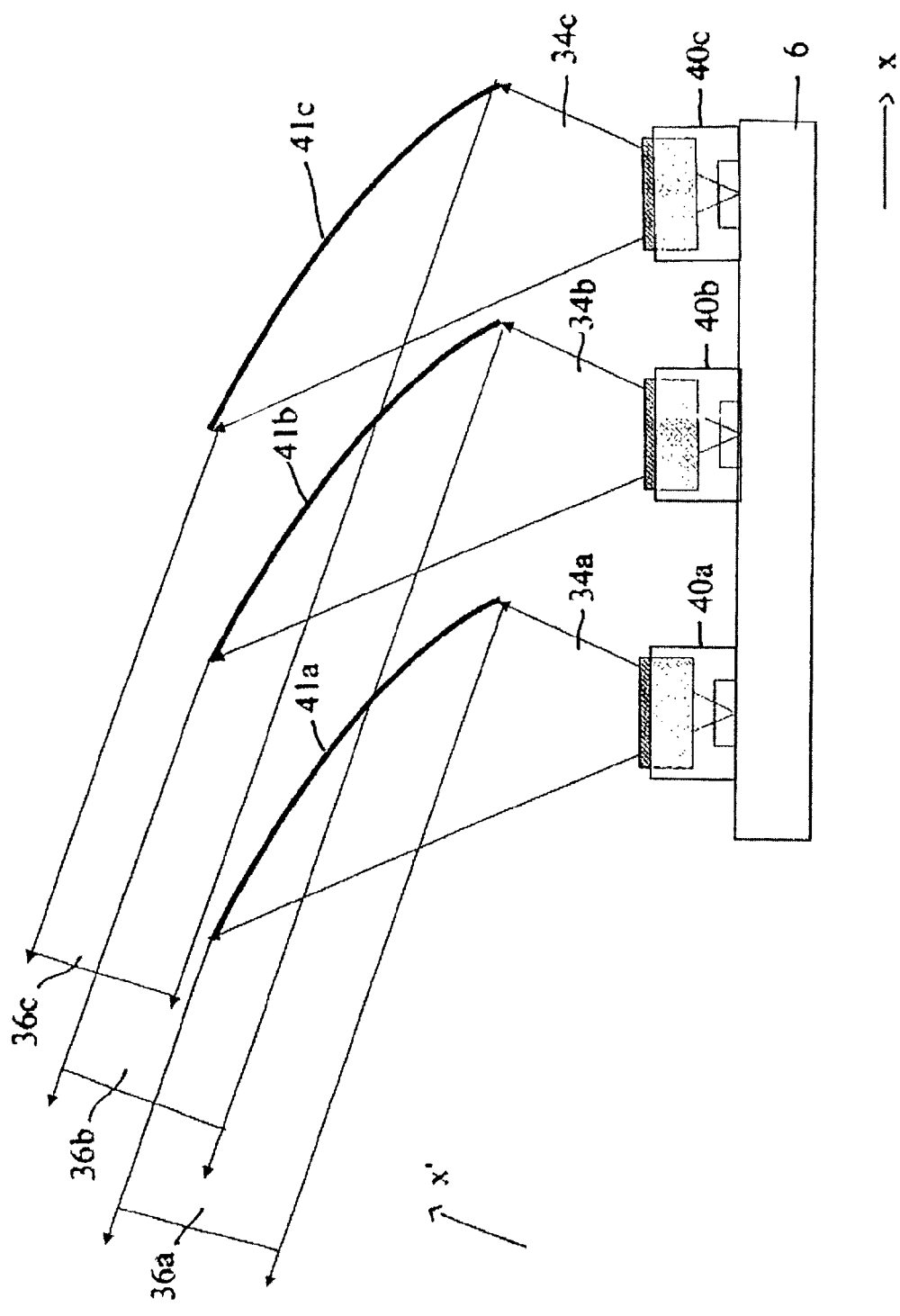
FIG. 6c shows a high power laser diode array according to a second embodiment of the present invention for slow axis collimation of three linear high power laser diodes disposed in parallel with each other under a predetermined pitch in only one axis.

FIG. 6c shows another modification where all high power laser diodes 40a-40c are mounted on the top surface of a common planar heat sink 6. Further, the parabolic hollow mirrors 41a-41c image and deflect the output laser beams 34a-34c into a direction which is not parallel to the top surface of the heat sink 6 but extends instead in an oblique manner. Again the deflected output laser beams 36a-36c are collimated in both fast and slow axis direction. Thus, the laser light emitters in the configuration of FIG. 6c are shifted in two axes perpendicular to each other.

According to a further related aspect of the present invention, the parabolic hollow mirrors shown in FIG. 6a and FIG. 6c can be integrated into a unitary (one-piece) substrate, e.g. by diamond-machining or micro-machining. Preferably, the substrate is of copper to enable an effective cooling from the backside close to the optical active surface making dense stacking of lenses possible and minimizing thermal lensing and its associated beam distortion known from refractive lens systems operated at high power levels. After forming the parabolic hollow mirrors in such a substrate, the inner surfaces of the hollow mirrors may be coated with a high-reflective coating, in order to reduce optical losses as far as possible. As an alternative, such an array of hollow mirrors may be press-formed or machined with other state-of the-art means for manufacturing lenses or lens arrays into a solid glass body or into the top surface of a hollow glass body that can be cooled by forced air circulating therethrough.

Figure 6D:
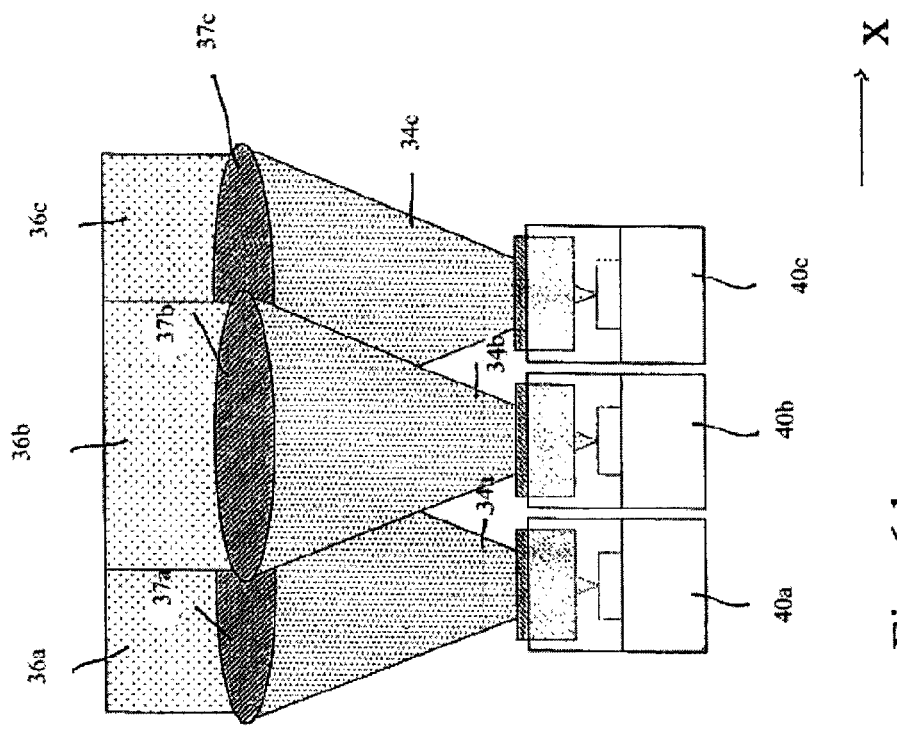
FIG. 6d shows a high power laser diode array according to a third embodiment of the present invention for slow axis collimation of three linear high power laser diodes disposed in parallel with each other under a predetermined pitch in one axis.
Figure 6E:
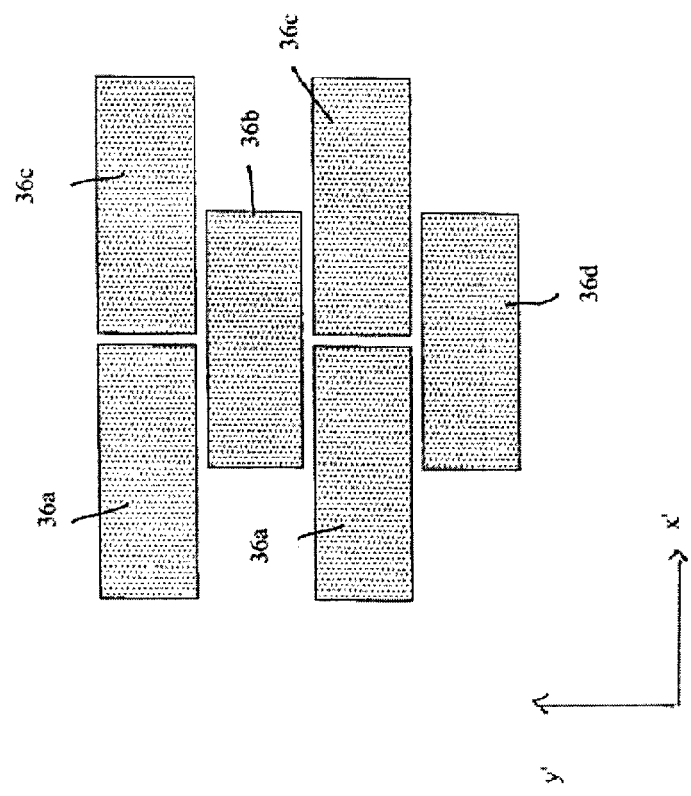
FIG. 6e shows the beam profile obtained using the third embodiment shown in FIG. 6d.
Figure 6F:
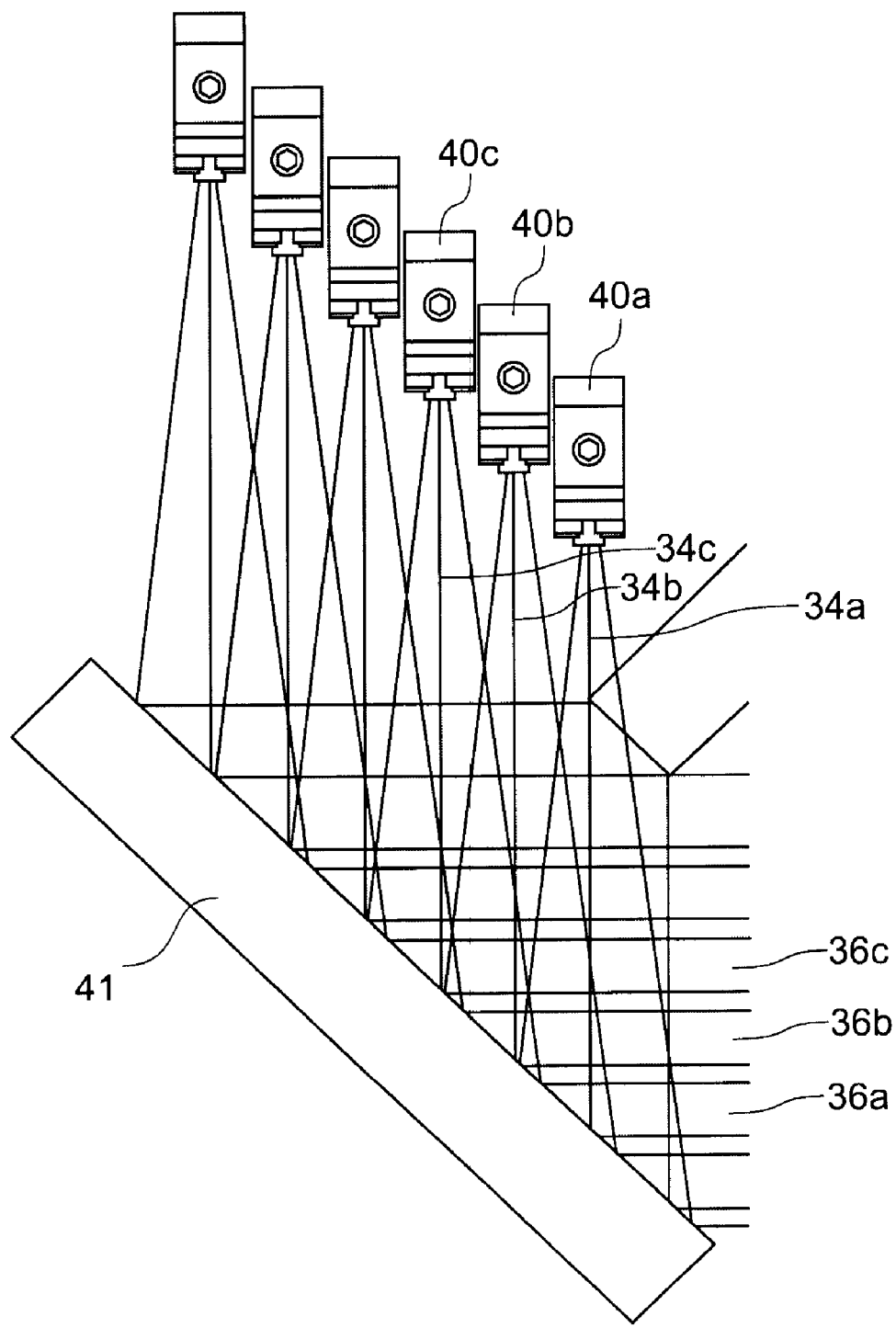
FIG. 6f shows a top view of the high power laser diodes of the first embodiment shown in FIG. 6a together with the slow axis collimators integrated into a common heat sink.
Figure 6F:
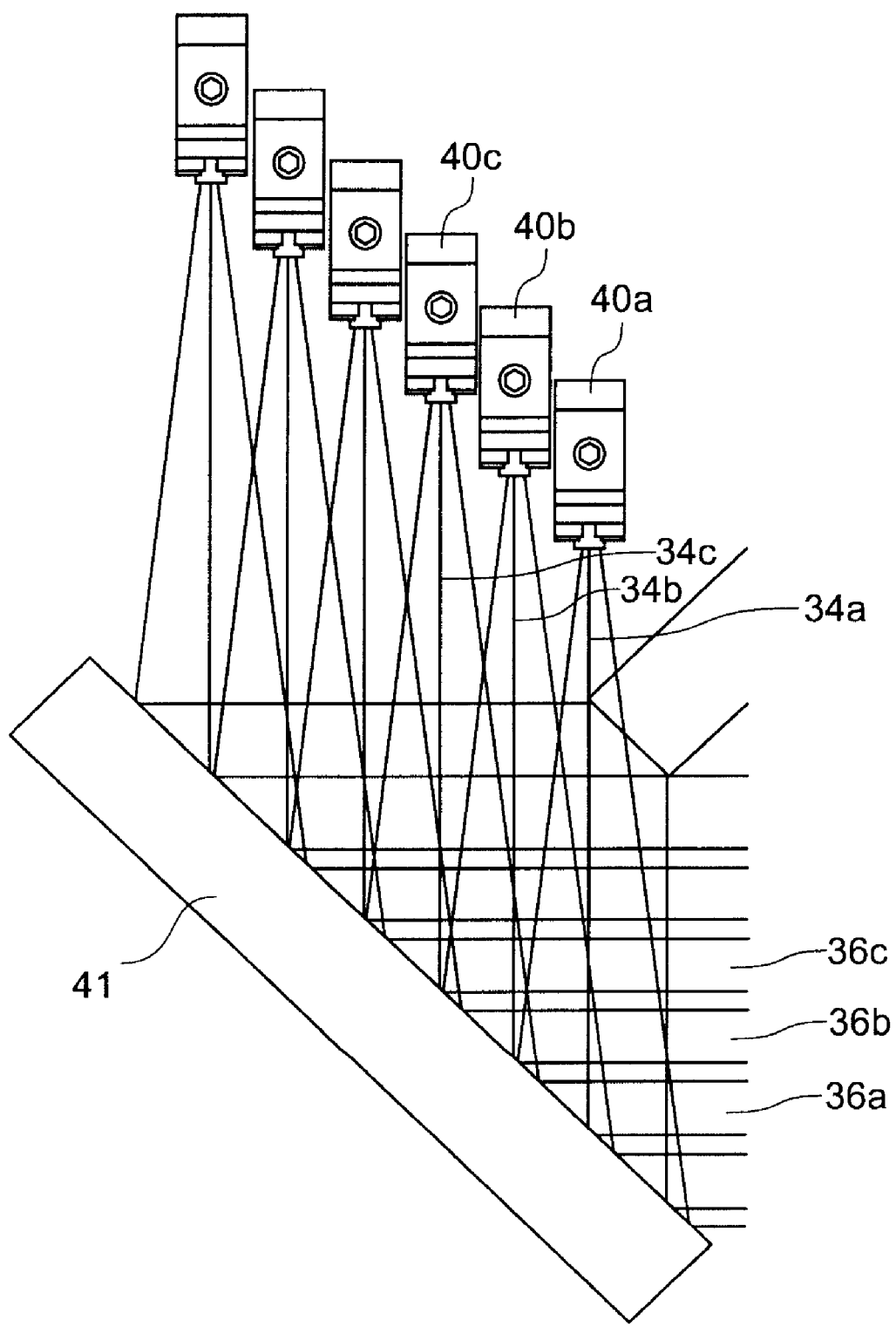

Such a modification is schematically shown in FIG. 6f. Further advantages of the reflective parabolic (slow axis) collimation optic are that the fill rate of the individual optic can be close to 100% without the loss of beam quality in contrast to refractive optics, which show beam distortion due to the edges of the lens and that parabolic surfaces represent the ideal optical surface for minimizing blur thus maximizing coupling efficiency into optical fibers at small diameters.

FIG. 6d shows another modification where all high power laser diodes 40a-40c are aligned in a single plane and where the output fast-axis collimated laser 34a-34c are slow-axis collimated by means of refractive lenses 36a-36c, which may also be a lens array. Thus, the laser light emitters in the configuration of FIG. 6d are shifted in two axes perpendicular to each other. As shown in FIG. 6e by suitably arranging the high power laser diodes 40a-40c and the slow-axis collimating lenses 37a-37c in an interleaved manner, the deflected output laser beams 36a-36c are interleaved in a substantially seamless manner, as indicated by the resulting schematic beam profile shown in FIG. 6e. As the individual output laser beams 36a-36c are substantially equally collimated in fast and slow axis direction, the resulting beam profile shown in FIG. 6e exhibits a substantially homogenous intensity distribution of the encompassing beam profile of the individual beams with substantially equal divergence in slow and fast axis.

It will become apparent to a person skilled in the art that the divergences of the individual beams and the combined beam may be different in both axes to comply with a specific application. In a similar matter the number of high power diode lasers and the number of diodes comprising one high power diode laser is determined by the beam quality and spot size at the workpiece upon focusing the collimated beam.

Figure 6H:
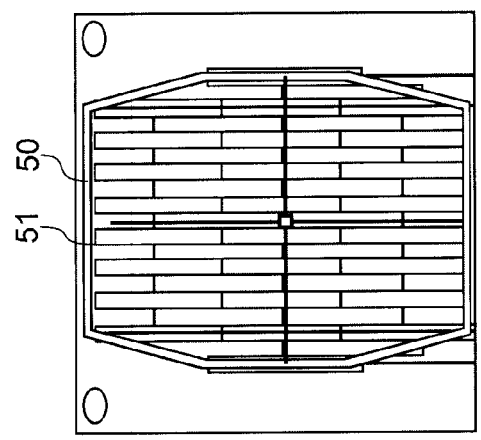
FIG. 6h shows the slow axis collimator array used with the optical setup shown in FIG. 6g.
Figure 6G:
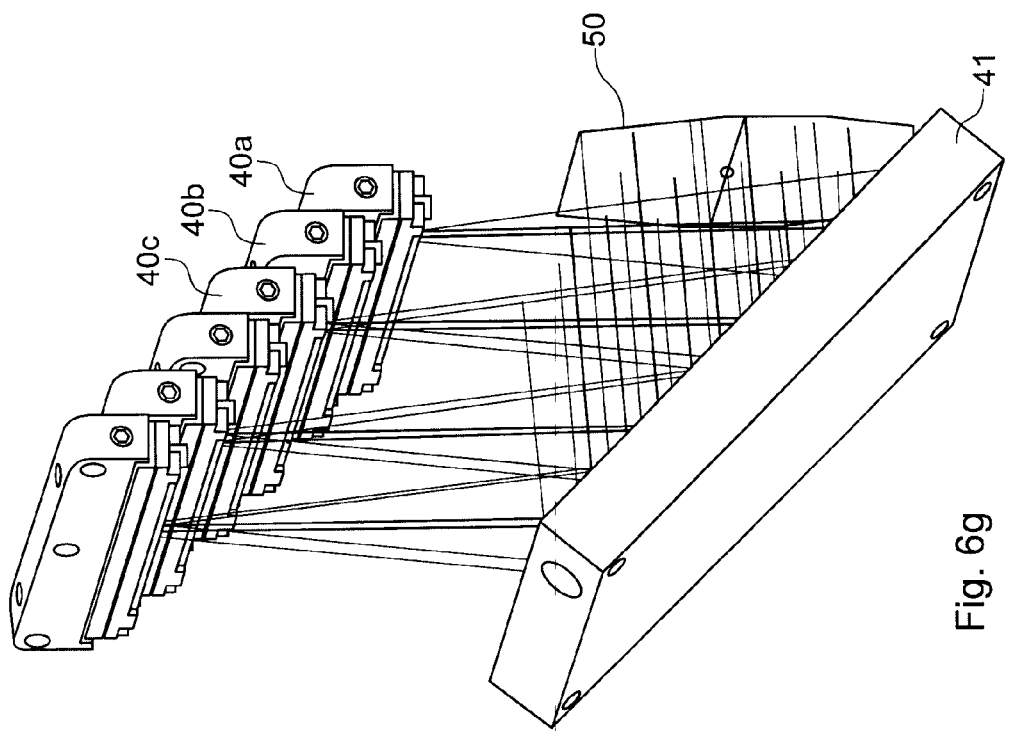
FIG. 6g shows a perspective view of the optical setup shown in FIG. 6f.

FIGS. 6f and 6g show in a side view and a perspective view a high power laser diode array according to the present invention. A unitary (single-piece) array 41 of parabolic hollow mirrors is used for slow-axis collimation of the fast-axis collimated light beams emitted by the laser diodes of which only three are denoted by reference numerals 40a-c in these drawings to thereby deflect and image the fast and slow axis collimated light beams in an interleaved manner so as to generate a substantially homogenous output laser beam profile 50 (cf. FIG. 6h) consisting of a plurality of fast and slow axis collimated laser beams 51 of substantially rectangular shape and interleaved in a seamless manner.

It will become apparent to a person skilled in the art that by an appropriate arrangement and configuration of the slow-axis collimating lenses 36a-36c and the high power laser diodes 40a-40c it is possible to obtain a beam profile of an arbitrary shape, e.g. line-shaped, rectangular, circular, elliptical, star-shaped. This effect can be used to efficiently image and couple the output laser beam to other optical components, such as optical fibres, laser rods (for optical pumping of secondary laser sources) or any sort of optical medium.

Figure 6I:
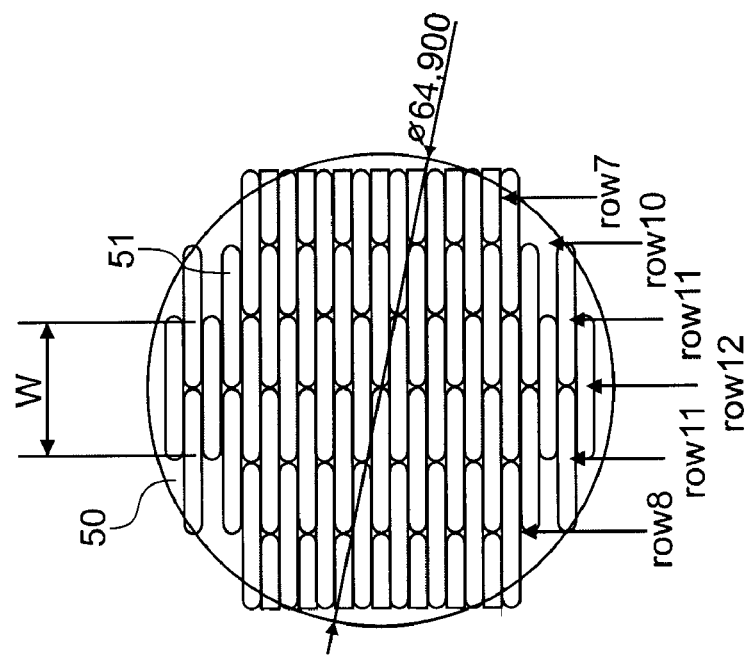
FIG. 6i shows a laser light source according to the present invention, wherein the output laser beam of a high power laser diode array according to the present invention is focused onto the entrance facet of an optical fibre.
Figure 6I:
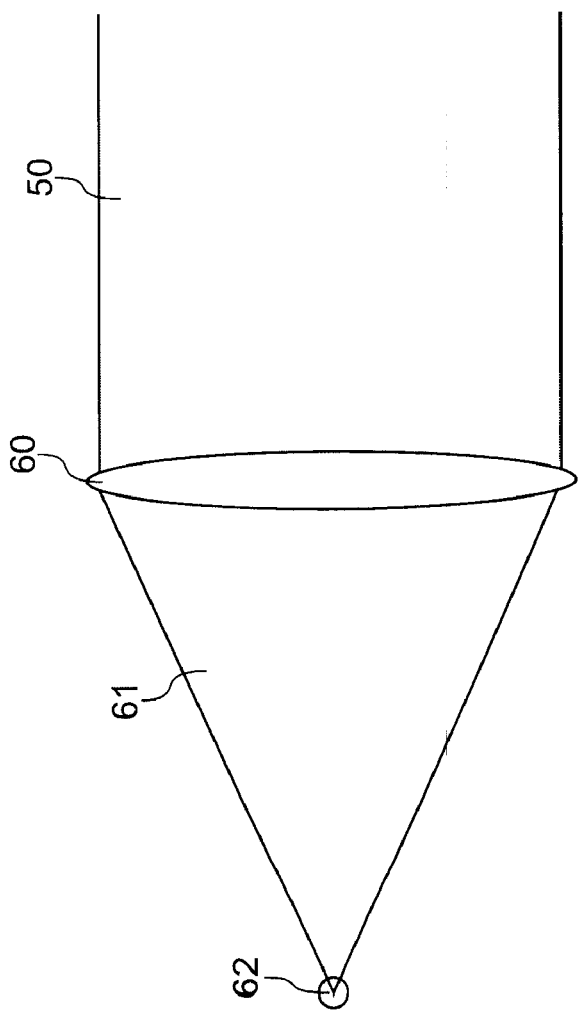

As an example of an application of a high power laser diode array of the present invention, FIG. 6i illustrates the focussing of an output laser beam 50 of the high power laser diode array as described above onto the entrance aperture 62 of an optical fibre by means of a focussing optics, generally denoted as 60. As shown in the right-hand part of FIG. 6i the output laser beam 50 consists of a plurality of substantially rectangular-shaped individual laser beams 51 that are collimated both in fast and slow axis by the optical arrangement described above with reference to FIG. 5a to 5h. Within the circle denoted in the right-hand part of FIG. 6i with reference numeral 50, which corresponds to the substantially circular entrance aperture 62 of the optical fibre, the individual laser beams 51 are interleaved in a substantially seamless manner, i.e. fill out the entire circle 50. As will become apparent from the schematic drawing in the right-hand part of FIG. 6i, the chess-board like interleaving of the individual fast and slow axis collimated laser beams according to the present invention enables filling out arbitrary cross-sectional geometric profiles, e.g. in the example of FIG. 6i the circle 50.

Figure 7:
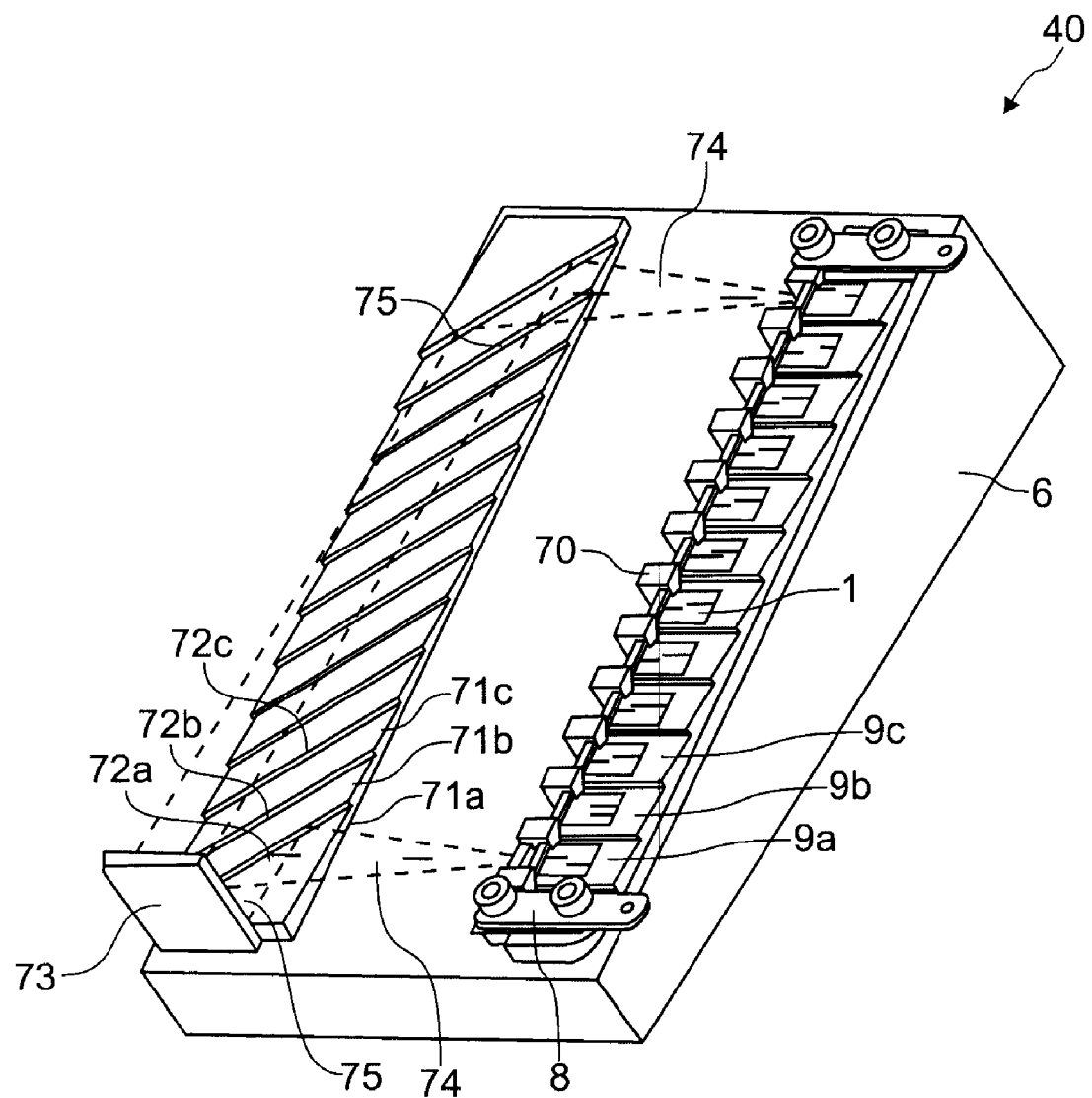
FIG. 7 shows another embodiment of the present invention wherein the laser light emitters are each disposed individually on a step-like substrate with monolithic slow axis beam shaping means on an opposite side.

FIG. 7 shows a high power laser diode array according to another embodiment of the present invention. The array comprises a wedge-shaped substrate 6. On the right-hand side of the substrate 6 a plurality of step-like laser diode support portions 9a-9c are formed, on the surface of which submounts are individually positioned. On the surface of each submount, a laser diode is mounted. For a precise positioning of these components, precision mounting tools, as outlined above, are used. Thus, the individual laser light emitters of the high power laser diode 40 on the right-hand side of substrate 6 are offset relative to each other both in fast axis and slow axis direction at equal spacings. In front of the exit facet of each laser light emitter there is provided a fast axis collimating means 70, which is individually positioned and aligned.

On the opposite, i.e. left-hand side of substrate 6 a corresponding number of step-like portions 71a-71c are provided. Edges of these portions 71a-71c are concavely curved to act as hollow-mirrors 72a-72c for slow axis collimation or focussing of the fast axis collimated laser beams 74. At the same time the fast axis collimated laser beams 74 are deflected by 90 degrees. The deflected fast and slow axis collimated laser beams 75 are then combined via mirror 73 to form a line-shaped output laser beam profile (not shown) consisting of a plurality of fast and slow axis collimated or focussed output laser beams arranged adjacent to each in a seamless manner in one dimension with an optical fill factor of 100% or close to 100%.

As will become apparent to a person skilled in the art, several of such high power laser diode arrays, as described with reference to FIG. 7, can be combined to form an output laser beam profile consisting of a plurality of fast and slow axis collimated or focussed output laser beams arranged adjacent to each in a seamless manner in two dimensions, at arbitrary shape, with an optical fill factor of 100% or close to 100%.

FIG. 8 shows a high power laser diode array according to still another embodiment of the present invention. As shown in FIG. 8, the diode lasers 40a-40c each of the type as described above with reference to FIG. 4a to 5h emit fast axis collimated laser beams 34a-34c that are aligned along (in this example) three single rows, the laser light emitters of each row being disposed at equidistant spacings between neighbouring laser light emitters. According to FIG. 8 the hollow parabolic mirrors 41a-41c focus the output laser beams 34a-34c both in fast axis direction and slow axis direction onto a single focal point 62. It is apparent to a person skilled in the art that each fast and slow axis focusing mirror 41a-4c has a slightly different focal length to ensure that all output laser beams are focussed onto the same focal point 62. The mirrors 41a-41c may be integrated into a single common substrate, as described above with reference to FIG. 6f.

LIST OF REFERENCE NUMERALS 1 submount
2 diode laser chip
3 bond pad for n-contact
4 bond pad for p-contact
5 electric wires for n-contact
6 heat sink
7 mirror
8 power connector
9a-c laser diode support portions
10 carrier/support substrate for fast axis collimating lens (FAC)
11 inner perimeter of spacer and alignment substrate 10
12 outer perimeter of spacer and alignment substrate 10
14 central cut-out portion
16 right cut-out portion
18 gap
22 inward protrusion
23 outward recess
25 lower recess in bottom surface of lower substrate 26
26 lower substrate of spacer and alignment substrate 10
27 upper recess in top surface of upper substrate 28
28 upper substrate of spacer and alignment substrate 10
30 uncollimated light beam
31 optical axis
32 collimating lens (fast axis)
33 rear side of collimating lens (fast axis)
34 fast axis collimated light beam
35 collimating lens (slow axis)
36 fast axis collimated light beam
37a, 37b, 37c slow-axis collimating lens
40 high power laser diode
40a, 40b, 40c laser diode row
41a, 41b, 41c parabolic mirror
50 output beam profile
51 individual laser beams collimated in slow and fast axis
60 focussing optics
61 focussed output light beam
62 entrance aperture/optical fibre
70 fast axis collimating means
71a-c step portion
72a-c concavely curved reflective surfaces
73 output mirror
74 fast axis collimated laser beam
75 slow axis collimated laser beam
101 submount
102 diode laser chip
103 bond pad for n-contact
104 bond pad for p-contact
105 electric wires for n-contact
106 heat sink
107 mirror
116 right cut-out portion
117 first step portion
118 alignment stop (slow axis)
119 second step portion
121 abutment surface
130 transparent spacer
300 first surface
301 second surface
131 uncollimated light beam
132 optical axis
133 collimating lens (fast axis)
134 fast axis collimated light beam
136 beam superposing means
137 collimating lens (slow axis)
138 collimated light beam

What is claimed is:

1. A high power laser diode array, comprising:
   at least one high power laser diode comprising a plurality of laser light emitters for emitting output laser beams, each defining, in a direction perpendicular to a direction of propagation of an output laser beam, a fast axis and a slow axis;
   fast axis collimating means for collimating said output laser beams in fast axis direction to provide fast axis collimated output laser beams; and
   slow axis beam shaping means for collimating or focussing said output laser beams in slow axis direction, said slow axis beam shaping means being disposed external to said at least one high power laser diode; wherein
   said laser light emitters are displaced relative to each other in fast axis direction or in fast and slow axis direction by equidistant spacings, respectively; and
   an optical means is provided for forming an output laser beam profile in the far field of all laser light emitters consisting of said plurality of fast and slow axis collimated or focussed output laser beams arranged adjacent to each in a seamless manner in one dimension or in two dimensions with an optical fill factor of 100% or close to 100%; and wherein
   said slow axis beam shaping means is comprised by or formed by said optical means.

2. The high power laser diode array as claimed in claim 1, wherein said slow axis beam shaping means does not rearrange the individual output laser beams of said laser light emitters.

3. The high power laser diode array as claimed in claim 1, said slow axis beam shaping means being configured for collimating said output laser beams in slow axis direction, such that said high power laser diode array provides fast and slow axis collimated output laser beams of a predetermined width in fast axis direction and slow axis direction, respectively, wherein
   said laser light emitters are displaced relative to each other in fast axis direction by a fraction 1/n of said predetermined width in fast axis direction, n being an integer larger than or equal to 1, and/or in slow axis direction by a fraction 1/n of said predetermined width in slow axis direction, n being an integer larger than or equal to 1.

4. The high power laser diode array as claimed in claim 3, wherein said laser light emitters are aligned along at least two rows at equidistant spacings between two neighbouring laser light emitters of a respective row in fast axis direction and wherein neighbouring rows of high power laser diodes are alternately shifted in slow axis direction by a fraction 1/n of said spacing, n being an integer larger than or equal to 1.

5. The high power laser diode array as claimed in claim 4, wherein each of said high power laser diodes emits a plurality of fast and slow axis collimated output laser beams spaced apart from each other, the output fast and slow axis collimated laser beams of two neighbouring rows of high power laser diodes intermeshing in a comb-like manner.

6. The high power laser diode array as claimed in claim 5, wherein neighbouring rows are each displaced relative to each other in beam propagation direction at a predetermined distance.

7. The high power laser diode array as claimed in claim 1, wherein each of said slow axis beam shaping means is a reflective parabolic hollow mirror of a shape suited for collimating or focussing an associated output laser beam in slow axis direction.

8. The high power laser diode array as claimed in claim 7, wherein several or all of said parabolic hollow mirrors are formed in a common substrate by micro-machining or diamond-machining of said substrate, preferably a copper body, or by press-forming of a glass.

9. The high power laser diode array as claimed in claim 8, wherein said common substrate is actively cooled, preferably by a fluid flowing through the common substrate, to avoid excessive heating of the common substrate due to reflective and/or absorptive losses caused by said parabolic hollow mirrors.

10. The high power laser diode array as claimed in claim 1, wherein each of said slow axis beam shaping means is a refractive optical element, in particular a lens array, configured for collimating or focussing the associated output laser beam in slow axis direction.

11. The high power laser diode array as claimed in claim 1, wherein each of said slow axis beam shaping means is a slow axis beam focusing means configured for focusing the respective output laser beam in slow axis direction at a respective distance between an associated row of high power laser diodes and said slow axis beam focusing means corresponding to a focal length of said slow axis beam focussing means.

12. The high power laser diode array as claimed in claim 11, wherein each of said slow axis beam focusing means further serves as a fast axis beam focussing means configured for focusing the respective output laser beam in fast axis direction at a respective distance between an associated row of high power laser diodes and said slow and fast axis beam focusing means corresponding to a focal length of said slow and fast axis light focussing means thus eliminating a separate optical element for focusing the plurality of output laser beams.

13. The high power laser diode array as claimed in claim 12, wherein each of said fast and/or slow axis beam focussing means has a slightly varying focusing length, depending on the position of the actual laser light emitter and its distance to the common spot of all laser light emitters.

14. The high power laser diode array as claimed in claim 1, wherein all laser light emitters of a high power laser diode are mounted on a common heatsink incorporating bending mirrors to deflect the beams of each laser light emitter by a specific angle, preferably by 90 degrees, in a direction inclined to the mounting plane of the laser light emitters.

15. The high power laser diode array as claimed in claim 1, wherein all laser light emitters of a high power laser diode are mounted on a common heatsink shaped like a staircase without incorporating bending mirrors.

16. The high power laser diode array as claimed in claim 1, wherein said fast axis collimating means is or are integrated into a respective high power laser diode.

17. The high power laser diode array as claimed in claim 16, each of said high power diode lasers comprising
a common heat sink for mounting all laser light emitters of a high power diode laser or a plurality of submounts used for mounting said laser light emitter; and
planar substrate means extending perpendicular to a direction of propagation output laser beams emitted by said laser light emitters;
said planar substrate means directly supporting said fast axis imaging collimating means.

18. The high power laser diode array as claimed in claim 17, said planar substrate means comprising
a plurality of cut outs each being formed on a lower surface of said planar substrate means and being configured for receiving a laser light emitter or a laser light emitter together with a submount and
at least one upper recess formed on an upper surface of said planar substrate means for receiving and/or supporting said fast axis light imaging means in a predetermined position and/or orientation.

19. The high power laser diode array as claimed in claim 18, wherein each of said fast axis beam collimating means is a spherical or aspherical cylindrical lens individually positioned within an upper recess of said planar substrate means for obtaining a predetermined collimation of an associated output laser beam in fast axis direction.

20. The high power laser diode array as claimed in claim 19, wherein each of said fast axis beam collimating means is individually tilted around an axis defined by the fast axis in a way to shift the slow axis position of each individual light emitter by a predetermined amount.

21. The high power laser diode array as claimed in claim 20, wherein said cylindrical lens is bonded only to inner side walls of said upper recess but is not supported by a bottom of said upper recess.

22. The high power laser diode array as claimed in claim 1, wherein each of said laser light emitters is a diode laser bar each comprising a plurality of laser light emitters.

23. A laser light source, comprising an optical fibre, the high power laser diode array and focussing means for focussing said output laser beam onto the entrance facet of said optical fibre; said high power laser diode array, comprising:
at least one high power laser diode comprising a plurality of laser light emitters for emitting output laser beams, each defining, in a direction perpendicular to a direction of propagation of an output laser beam, a fast axis and a slow axis;
fast axis collimating means for collimating said output laser beams in fast axis direction to provide fast axis collimated output laser beams; and
slow axis beam shaping means for collimating or focussing said output laser beams in slow axis direction, said slow axis beam shaping means being disposed external to said at least one high power laser diode; wherein
said laser light emitters are displaced relative to each other in fast axis direction or in fast and slow axis direction by equidistant spacings, respectively; and
an optical means is provided for forming an output laser beam profile in the far field of all laser light emitters consisting of said plurality of fast and slow axis collimated or focussed output laser beams arranged adjacent to each in a seamless manner in one dimension or in two dimensions with an optical fill factor of 100% or close to 100%; and wherein
said slow axis beam shaping means is comprised by or formed by said optical means.

* * * * *

UNITED STATES PATENT AND TRADEMARK OFFICE
CERTIFICATE OF CORRECTION

PATENT NO. : 7,751,458 B2 Page 1 of 1
APPLICATION NO. : 12/270945
DATED : July 6, 2010
INVENTOR(S) : Regaard et al.

It is certified that error appears in the above-identified patent and that said Letters Patent is hereby corrected as shown below:

Column 20, line 27, should read to each <u>other</u> in a seamless

Column 22, line 56, should read to each <u>other</u> in a seamless

Signed and Sealed this

Thirty-first Day of August, 2010

David J. Kappos
*Director of the United States Patent and Trademark Office*